United States Patent
Rotem et al.

(10) Patent No.: US 11,593,544 B2
(45) Date of Patent: Feb. 28, 2023

(54) SYSTEM, APPARATUS AND METHOD FOR ADAPTIVE OPERATING VOLTAGE IN A FIELD PROGRAMMABLE GATE ARRAY (FPGA)

(71) Applicant: Intel Corporation, Santa Clara, CA (US)

(72) Inventors: Efraim Rotem, Haifa (IL); Boris Mishori, Tsur Yitzhak (IL); Eran Dagan, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 409 days.

(21) Appl. No.: 16/629,600

(22) PCT Filed: Aug. 23, 2017

(86) PCT No.: PCT/US2017/048149
§ 371 (c)(1),
(2) Date: Jan. 9, 2020

(87) PCT Pub. No.: WO2019/040054
PCT Pub. Date: Feb. 28, 2019

(65) Prior Publication Data
US 2021/0064804 A1    Mar. 4, 2021

(51) Int. Cl.
*G06F 30/00* (2020.01)
*G06F 30/34* (2020.01)
(Continued)

(52) U.S. Cl.
CPC ............ *G06F 30/34* (2020.01); *G06F 1/3296* (2013.01); *G06F 15/7867* (2013.01)

(58) Field of Classification Search
None
See application file for complete search history.

(56) References Cited

U.S. PATENT DOCUMENTS

| | | |
|---|---|---|
| 5,163,153 A | 11/1992 | Cole et al. |
| 5,522,087 A | 5/1996 | Hsiang |

(Continued)

FOREIGN PATENT DOCUMENTS

| | | |
|---|---|---|
| EP | 1 282 030 A1 | 5/2003 |
| WO | 2013102230 A1 | 7/2013 |

OTHER PUBLICATIONS

M. Pasotti et al., "An application specific embeddable flash memory system for non-volatile storage of code, data and bit-streams for embedded FPGA configurations," 2003 Symposium on VLSI Circuits. Digest of Technical Papers (IEEE Cat. No. 03CH37408), 2003, pp. 213-216, doi: 10.1109/VLSIC.2003.1221206. (Year: 2003).*

(Continued)

*Primary Examiner* — Daniel F. McMahon
(74) *Attorney, Agent, or Firm* — Trop, Pruner & Hu, P.C.

(57) ABSTRACT

In one embodiment, a field programmable gate array (FPGA) includes: at least one programmable logic circuit to execute a function programmed with a bitstream; a self-test circuit to execute a self-test at a first voltage, the self-test and the first voltage programmed with first metadata associated with the bitstream, the self-test including at least one critical path length of the function; and a power controller to identify an operating voltage for the at least one programmable logic circuit based at least in part on the execution of the self-test at the first voltage.

20 Claims, 20 Drawing Sheets

(51) Int. Cl.
  *G06F 1/3296* (2019.01)
  *G06F 15/78* (2006.01)

(56) References Cited

U.S. PATENT DOCUMENTS

| | | |
|---|---|---|
| 5,590,341 A | 12/1996 | Matter |
| 5,621,250 A | 4/1997 | Kim |
| 5,931,950 A | 8/1999 | Hsu |
| 6,112,020 A | 8/2000 | Wright |
| 6,625,788 B1* | 9/2003 | Vashi ............... G06F 30/30 716/108 |
| 6,748,546 B1 | 6/2004 | Mirov et al. |
| 6,792,392 B1 | 9/2004 | Knight |
| 6,823,516 B1 | 11/2004 | Cooper |
| 6,829,713 B2 | 12/2004 | Cooper et al. |
| 6,874,108 B1* | 3/2005 | Abramovici ..... H03K 19/17764 714/E11.169 |
| 6,996,728 B2 | 2/2006 | Singh |
| 7,010,708 B2 | 3/2006 | Ma |
| 7,043,649 B2 | 5/2006 | Terrell |
| 7,093,147 B2 | 8/2006 | Farkas et al. |
| 7,111,179 B1 | 9/2006 | Girson et al. |
| 7,138,815 B1 | 11/2006 | Alexander et al. |
| 7,194,643 B2 | 3/2007 | Gonzalez et al. |
| 7,272,730 B1 | 9/2007 | Acquaviva et al. |
| 7,412,615 B2 | 8/2008 | Yokota et al. |
| 7,434,073 B2 | 10/2008 | Magklis |
| 7,437,270 B2 | 10/2008 | Song et al. |
| 7,454,632 B2 | 11/2008 | Kardach et al. |
| 7,525,331 B1* | 4/2009 | Jairam ........... G01R 31/318519 714/724 |
| 7,529,956 B2 | 5/2009 | Stufflebeam |
| 7,539,885 B2 | 5/2009 | Ma |
| 7,730,340 B2 | 6/2010 | Hu et al. |
| 7,840,918 B1* | 11/2010 | Duthou ............... G06F 30/39 716/132 |
| 7,859,918 B1* | 12/2010 | Nguyen ................. G05F 3/242 365/210.1 |
| 8,130,027 B1* | 3/2012 | Tuan ................ H03K 19/17792 327/535 |
| 8,461,869 B1 | 6/2013 | Rahim et al. |
| 8,725,488 B2* | 5/2014 | Hofmann ............. G06F 1/3296 703/23 |
| 8,892,903 B1* | 11/2014 | Trimberger ........... G06F 21/755 713/189 |
| 8,896,346 B1 | 11/2014 | Lewis et al. |
| 9,231,591 B1* | 1/2016 | Lesea ............. G06F 11/1695 |
| 9,323,876 B1* | 4/2016 | Lysaght ................ G06F 30/34 |
| 9,335,977 B2* | 5/2016 | Wang ................ G06F 9/4494 |
| 9,564,233 B1* | 2/2017 | Cho ..................... G11C 16/10 |
| 10,379,596 B2 | 8/2019 | Weissmann et al. |
| 10,429,919 B2 | 10/2019 | Rotem et al. |
| 2001/0044909 A1 | 11/2001 | Oh et al. |
| 2002/0194509 A1 | 12/2002 | Plante et al. |
| 2003/0061383 A1 | 3/2003 | Zilka |
| 2004/0064752 A1 | 4/2004 | Kazachinsky et al. |
| 2004/0098560 A1 | 5/2004 | Storvik et al. |
| 2004/0139356 A1 | 7/2004 | Ma |
| 2004/0268166 A1 | 12/2004 | Farkas et al. |
| 2005/0022038 A1 | 1/2005 | Kaushik et al. |
| 2005/0033881 A1 | 2/2005 | Yao |
| 2005/0132238 A1 | 6/2005 | Nanja |
| 2006/0050670 A1 | 3/2006 | Hillyard et al. |
| 2006/0053326 A1 | 3/2006 | Naveh |
| 2006/0059286 A1 | 3/2006 | Bertone et al. |
| 2006/0069936 A1 | 3/2006 | Lint et al. |
| 2006/0117202 A1 | 6/2006 | Magklis et al. |
| 2006/0184287 A1 | 8/2006 | Belady et al. |
| 2006/0259840 A1 | 11/2006 | Abadeer et al. |
| 2007/0005995 A1 | 1/2007 | Kardach et al. |
| 2007/0016817 A1 | 1/2007 | Albonesi et al. |
| 2007/0079294 A1 | 4/2007 | Knight |
| 2007/0106827 A1 | 5/2007 | Boatright et al. |
| 2007/0156992 A1 | 7/2007 | Jahagirdar |
| 2007/0164785 A1 | 7/2007 | He |
| 2007/0214342 A1 | 9/2007 | Newburn |
| 2007/0239398 A1 | 10/2007 | Song et al. |
| 2007/0245163 A1 | 10/2007 | Lu et al. |
| 2008/0028240 A1 | 1/2008 | Arai et al. |
| 2008/0180129 A1* | 7/2008 | Nabaa .............. H03K 19/17784 326/38 |
| 2008/0250260 A1 | 10/2008 | Tomita |
| 2009/0006871 A1 | 1/2009 | Liu et al. |
| 2009/0150695 A1 | 6/2009 | Song et al. |
| 2009/0150696 A1 | 6/2009 | Song et al. |
| 2009/0158061 A1 | 6/2009 | Schmitz et al. |
| 2009/0158067 A1 | 6/2009 | Bodas et al. |
| 2009/0172375 A1 | 7/2009 | Rotem et al. |
| 2009/0172428 A1 | 7/2009 | Lee |
| 2009/0235105 A1 | 9/2009 | Branover et al. |
| 2010/0115309 A1 | 5/2010 | Carvalho et al. |
| 2010/0146513 A1 | 6/2010 | Song |
| 2010/0191997 A1 | 7/2010 | Dodeja et al. |
| 2011/0154090 A1 | 6/2011 | Dixon et al. |
| 2011/0276321 A1* | 11/2011 | Tuan ..................... G06F 30/34 703/19 |
| 2012/0079290 A1 | 3/2012 | Kumar |
| 2012/0246506 A1 | 9/2012 | Knight |
| 2013/0061064 A1 | 3/2013 | Ananthakrishnan et al. |
| 2013/0080803 A1 | 3/2013 | Ananthakrishnan et al. |
| 2013/0080804 A1 | 3/2013 | Ananthakrishnan et al. |
| 2013/0111120 A1 | 5/2013 | Ananthakrishnan et al. |
| 2013/0111121 A1 | 5/2013 | Ananthakrishnan et al. |
| 2013/0111226 A1 | 5/2013 | Ananthakrishnan et al. |
| 2013/0111236 A1 | 5/2013 | Ananthakrishnan et al. |
| 2013/0346774 A1 | 12/2013 | Bhandaru et al. |
| 2014/0068290 A1 | 3/2014 | Bhandaru et al. |
| 2014/0195829 A1 | 7/2014 | Bhandaru et al. |
| 2014/0208141 A1 | 7/2014 | Bhandaru et al. |
| 2015/0316615 A1* | 11/2015 | Carmon ............ G01R 31/2607 702/117 |
| 2016/0125951 A1* | 5/2016 | Sun ..................... G11C 29/028 365/185.24 |
| 2017/0024004 A1* | 1/2017 | Tsuji .................... G06F 30/367 |
| 2018/0175858 A1* | 6/2018 | Hoede ............. H03K 19/17784 |
| 2019/0095564 A1* | 3/2019 | Atsatt ................ H03K 19/1774 |
| 2021/0111863 A1* | 4/2021 | Trivedi ................ G06F 21/577 |

OTHER PUBLICATIONS

J. Luis Nunez-Yanez, M. Hosseinabady and A. Beldachi, "Energy Optimization in Commercial FPGAs with Voltage, Frequency and Logic Scaling," in IEEE Transactions on Computers, vol. 65, No. 5, pp. 1484-1493, May 1, 2016, doi: 10.1109/TC.2015.2435771. (Year: 2015).*

International Search Report and Written Opinion for PCT/US2017/048149 dated May 23, 2018 (14 pages).

Intel Developer Forum, IDF2010, Opher Kahn, et al., "Intel Next Generation Microarchitecture Codename Sandy Bridge: New Processor Innovations," Sep. 13, 2010, 58 pages.

SPEC—Power and Performance, Design Overview V1.10, Standard Performance Information Corp., Oct. 21, 2008, 5 pages.

Intel Technology Journal, "Power and Thermal Management in the Intel Core Duo Processor," May 15, 2006, pp. 109-122.

Anoop Iyer, et al., "Power and Performance Evaluation of Globally Asynchronous Locally Synchronous Processors," 2002, pp. 1-11.

Greg Semeraro, et al., "Hiding Synchronization Delays in a GALS Processor Microarchitecture," 2004, pp. 1-13.

Joan-Manuel Parcerisa, et al., "Efficient Interconnects for Clustered Microarchitectures," 2002, pp. 1-10.

Grigorios Magklis, et al., "Profile-Based Dynamic Voltage and Frequency Scalling for a Multiple Clock Domain Microprocessor," 2003, pp. 1-12.

Greg Semeraro, et al., "Dynamic Frequency and Voltage Control for a Multiple Clock Domain Architecture," 2002, pp. 1-12.

Greg Semeraro, "Energy-Efficient Processor Design Using Multiple Clock Domains with Dynamic Voltage and Frequency Scaling," 2002, pp. 29-40.

Diana Marculescu, "Application Adaptive Energy Efficient Clustered Architectures," 2004, pp. 344-349.

(56) References Cited

OTHER PUBLICATIONS

L. Benini, et al., "System-Level Dynamic Power Management," 1999, pp. 23-31.

Ravindra Jejurikar, et al., "Leakage Aware Dynamic Voltage Scaling for Real-Time Embedded Systems," 2004, pp. 275-280.

Ravindra Jejurikar, et al., "Dynamic Slack Reclamation With Procrastination Scheduling in Real-Time Embedded Systems," 2005, pp. 13-17.

R. Todling, et al., "Some Strategies for Kalman Filtering and Smoothing," 1996, pp. 1-21.

R.E. Kalman, "A New Approach to Linear Filtering and Prediction Problems," 1960, pp. 1-12.

Intel Corporation, "Intel 64 and IA-32 Architectures Software Developer's Manual," vol. 3B: System Programming Guide, Part 2, Apr. 2016, Chapter 14 Power and Thermal Management (14.1-14.9.5), 42 pages.

Shuze Zhao, et al., "A Universal Self-Calibrating Dynamic Voltage and Frequency Scaling (DVFS) Scheme with Thermal Compensation for Energy Savings in FPGAs," 2016, 6 pages.

European Patent Office, Supplemental European Search Report dated Mar. 18, 2021 in European Patent Application No. 17922516.4 (8 pages).

\* cited by examiner

SYSTEM, APPARATUS AND METHOD FOR ADAPTIVE OPERATING VOLTAGE IN A FIELD PROGRAMMABLE GATE ARRAY (FPGA)

TECHNICAL FIELD

Embodiments relate to power management in integrated circuits.

BACKGROUND

Integrated circuits known as field programmable gate arrays (FPGAs) have gained large popularity in recent years, as these devices can be programmed by a given end user (such as a designer of a logic function to be configured into the FPGA) to efficiently perform particular computing tasks. FPGA programmable logic configuration, namely the functionality implemented by the FPGA, is typically determined in-field by the end user. As opposed to a fixed function design such as a general-purpose microprocessor, a given production FPGA may operate at varied frequencies from one FPGA logic configuration to another. This is caused by the type of logic function that is programmed into the FPGA. Some functions are more complex and have more speed limiting paths than others. Typical FPGAs are tested and set to a certain voltage according to a worst-case function possible for the FPGA as specified in the device specification. The same operating voltage is supplied to the FPGA even when its specific functional configuration may run at a lower frequency, providing a higher voltage than actually needed. This situation results in increased power consumption and/or lower performance.

DETAILED DESCRIPTION

Figure 1:
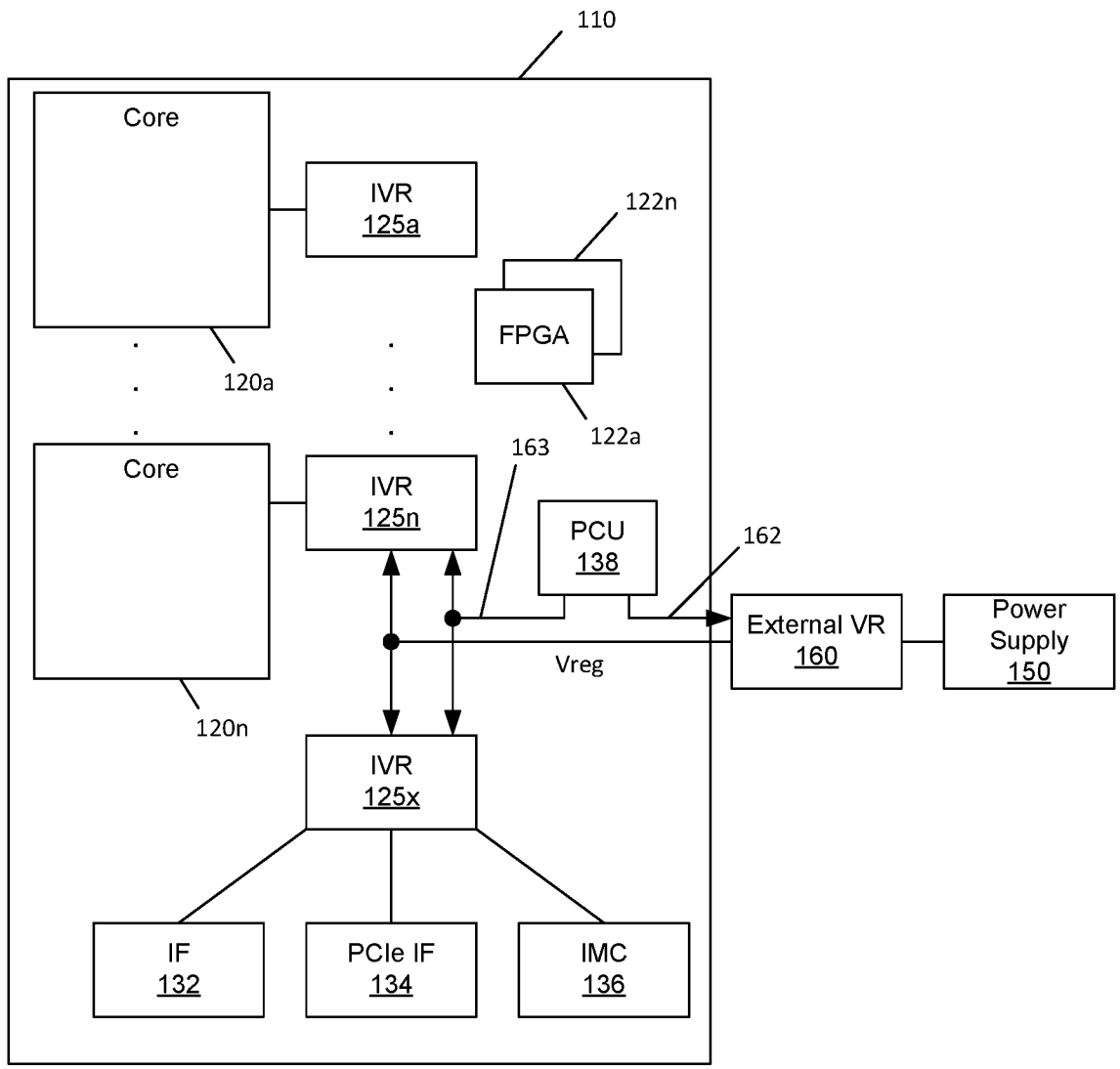
FIG. 1 is a block diagram of a portion of a system in accordance with an embodiment of the present invention.

In various embodiments, a FPGA or other programmable control logic may be dynamically controlled to operate at appropriate voltage/frequency (VF) values for a specific function configured into the FPGA. More specifically, embodiments provide techniques to enable identification of a minimum operating frequency (Vmin) at which a specific function configured into the FPGA can correctly and safely operate. In this way, an FPGA in accordance with an embodiment may reduce power consumption while ensuring correct operation and longevity of the FPGA.

In some embodiments, a semi-static configuration may be provided in which an FPGA is tested offline with the specific function that is loaded into the FPGA. In some cases, this test may be one or more high volume manufacturing (HVM) test routines that are used to test the FPGA during manufacturing. In other cases, this test may be provided by a synthesis tool such as an electronic design automation (EDA) synthesis tool that generates the configuration for the FPGA. Based on this testing, a VF curve is generated that provides a set of operating points each including a given operating frequency and operating voltage (either a full curve or a simplified offset to a specified worst-case situation). In turn, this VF curve may be provided to the FPGA together with the logical function that configures the device. In this semi-static configuration arrangement, the responsibility for testing and validation is on the designer that develops the logical function.

In other embodiments, dynamic testing can be performed upon loading the configuration, by way of a self-test of the FPGA. In such cases this self-test, which may be defined by a designer of the FPGA function, is executed to enable an operating voltage to be dynamically determined. This can be done for example by loading a design for test (DFT) function into the FPGA to execute on a self-test circuit of the FPGA. This DFT function may represent the worst-case speed path of the function. As an example, for DFT creation a synthesis tool can generate automatically a logic cone correlated to the critical path that can be used as the Vmin search self-test pattern itself.

In an embodiment, a VF curve generated based on this self-testing is used for the entire run time of the FPGA until a new function is configured. Note that in some cases if a given logic function does not have associated configured VF curve information or self-test information, a default voltage value as determined during HVM (and which may be stored in a non-volatile storage included in or associated with the FPGA) may be used. Note that this default voltage value may at a relatively high level to ensure that worst-case corner situations correctly operate.

As such in embodiments herein, bitstream information loaded into the FPGA during a boot routine can be used to detect a specific FPGA configuration scenario and identify an appropriate operating voltage, which in embodiments may be a minimum operating voltage at which the logic function correctly executes. To this end, the FPGA may include control circuitry or other control logic to control a voltage regulator (internal or external) according the specific unit and specific scenario. On reset of an FPGA, a FPGA boot routine occurs in which a bitstream (created offline by an EDA synthesis tool) is loaded. In addition to this bitstream, metadata is appended to the bitstream to provide information for use in determining an appropriate operating voltage for the particular FPGA. In an embodiment, this metadata may include a critical path length and one or more diagnostic tests to be executed within the FPGA (after reset) to identify an appropriate Vmin for the specific configuration.

Although the following embodiments are described with reference to energy conservation and energy efficiency in specific integrated circuits, such as in computing platforms or processors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to any particular type of computer systems. That is, disclosed embodiments can be used in many different system types, ranging from server computers (e.g., tower, rack, blade, micro-server and so forth), communications systems, storage systems, desktop computers of any configuration, laptop, notebook, and tablet computers (including 2:1 tablets, phablets and so forth), and may be also used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. More so, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future, such as for power conservation and energy efficiency in products that encompass a large portion of the US economy.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage Vreg to processor 110.

As seen, processor 110 may be a single die processor including multiple cores $120_a$-$120_n$. Processor 110 also may include multiple independent FPGA functional units $122_a$-$122_n$ (each of which may be a given programmable logic circuit), each of which may be program mably generated by a bitstream and controlled to operate at a given minimum operating voltage as described herein. In addition, each core (and FPGA) may be associated with an integrated voltage regulator (IVR) $125_a$-$125_n$ which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR may be powered down or off when the processor is placed into a certain low power state, while another power plane of another IVR remains active, or fully powered. Similarly, cores 120 may include or be associated with independent clock generation circuitry such as one or more phase lock loops (PLLs) to control operating frequency of each core 120 independently.

Still referring to FIG. 1, additional components may be present within the processor including an input/output interface (IF) 132, another interface 134, and an integrated memory controller (IMC) 136. As seen, each of these components may be powered by another integrated voltage regulator $125_x$. In one embodiment, interface 132 may enable operation for an Intel® Quick Path Interconnect (QPI) interconnect, which provides for point-to-point (PtP) links in a cache coherent protocol that includes multiple layers including a physical layer, a link layer and a protocol layer. In turn, interface 134 may communicate via a Peripheral Component Interconnect Express (PCIe™) protocol.

Also shown is a power control unit (PCU) 138, which may include circuitry including hardware, software and/or firmware to perform power management operations with regard to processor 110. As seen, PCU 138 provides control information to external voltage regulator 160 via a digital interface 162 to cause the voltage regulator to generate the appropriate regulated voltage. PCU 138 also provides control information to IVRs 125 via another digital interface 163 to control the operating voltage generated (or to cause a corresponding IVR to be disabled in a low power mode). In various embodiments, PCU 138 may include a variety of power management logic units or circuits to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software). PCU 138 may be configured to initiate self-testing of one or more FPGA programmable logic circuits to identify a minimum operating voltage, to be used during normal operation of processor 110.

In FIG. 1, PCU 138 is illustrated as being present as a separate circuit of the processor. In other cases PCU 138 may execute on a given one or more of cores 120. In some cases, PCU 138 may be implemented as a microcontroller (dedicated or general-purpose) or other control logic configured to execute its own dedicated power management code, sometimes referred to as P-code. In yet other embodiments, power management operations to be performed by PCU 138 may be implemented externally to a processor, such as by way of a separate power management integrated circuit (PMIC) or other component external to the processor. In yet other embodiments, power management operations to be performed by PCU 138 may be implemented within BIOS or other system software.

Embodiments may be particularly suitable for a multicore processor in which each of multiple cores can operate at an independent voltage and frequency point. As used herein the term "domain" is used to mean a collection of hardware and/or logic that operates at the same voltage and frequency point. In addition, a multicore processor can further include other non-core processing engines such as fixed function units, graphics engines, and so forth. Such processor can include independent domains other than the cores, such as one or more domains associated with a graphics engine (referred to herein as a graphics domain) and one or more domains associated with non-core circuitry, referred to herein as an uncore or a system agent. Although many implementations of a multi-domain processor can be formed on a single semiconductor die, other implementations can be realized by a multi-chip package in which different domains can be present on different semiconductor die of a single package.

While not shown for ease of illustration, understand that additional components may be present within processor 110 such as uncore logic, and other components such as internal memories, e.g., one or more levels of a cache memory hierarchy and so forth. Furthermore, while shown in the implementation of FIG. 1 with an integrated voltage regulator, embodiments are not so limited. For example, other regulated voltages may be provided to on-chip resources from external voltage regulator 160 or one or more additional external sources of regulated voltages.

Note that the power management techniques described herein may be independent of and complementary to an operating system (OS)-based power management (OSPM) mechanism. According to one example OSPM technique, a processor can operate at various performance states or levels, so-called P-states, namely from P0 to PN. In general, the P1 performance state may correspond to the highest guaranteed performance state that can be requested by an OS. In addition to this P1 state, the OS can further request a higher performance state, namely a P0 state. This P0 state may thus be an opportunistic, overclocking, or turbo mode state in which, when power and/or thermal budget is available, processor hardware can configure the processor or at least portions thereof to operate at a higher than guaranteed frequency. In many implementations a processor can include multiple so-called bin frequencies above the P1 guaranteed maximum frequency, exceeding to a maximum peak frequency of the particular processor, as fused or otherwise written into the processor during manufacture. In addition, according to one OSPM mechanism, a processor can operate at various power states or levels. With regard to power states, an OSPM mechanism may specify different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth). Note that using the demotion-based techniques herein, C-state requests from the OS can be overridden, based at least in part on customer tuning information provided via an interface as described herein.

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle.

Power management techniques also may be used when constraints exist in an operating environment. For example, when a power and/or thermal constraint is encountered, power may be reduced by reducing operating frequency and/or voltage. Other power management techniques include throttling instruction execution rate or limiting scheduling of instructions. Still further, it is possible for instructions of a given instruction set architecture to include express or implicit direction as to power management operations. Although described with these particular examples, understand that many other power management techniques may be used in particular embodiments.

Figure 2:
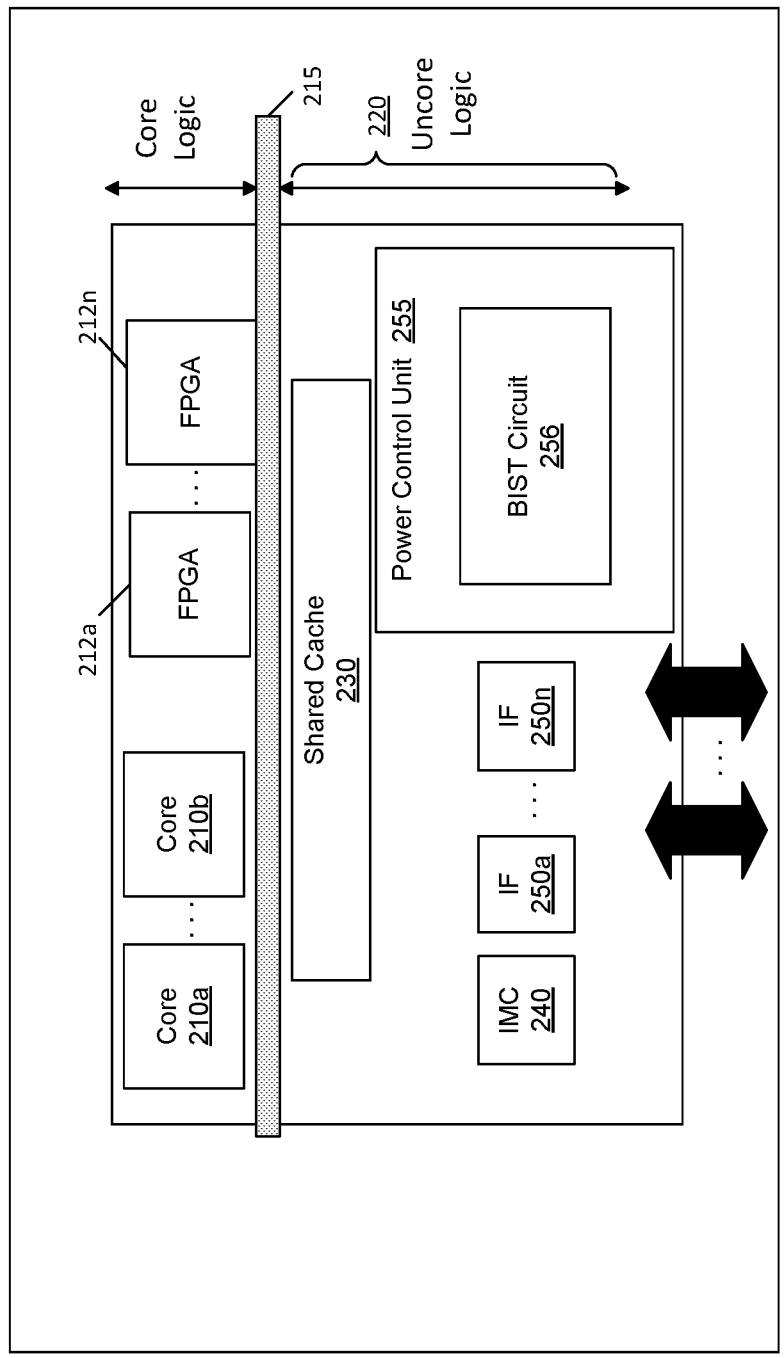
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores 210$_a$-210$_n$ and a plurality of FPGA programmable logic circuits 212$_a$-212$_n$. In one embodiment, each such core may be of an independent power domain and can be configured to enter and exit active states and/or maximum performance states based on workload. One or more cores 210 may be heterogeneous to the other cores, e.g., having different micro-architectures, instruction set architectures, pipeline depths, power and performance capabilities. The various cores may be coupled via an interconnect 215 to a system agent or uncore 220 that includes various components. As seen, the uncore 220 may include a shared cache 230 which may be a last level cache. In addition, the uncore may include an integrated memory controller 240 to communicate with a system memory (not shown in FIG. 2), e.g., via a memory bus. Uncore 220 also includes various interfaces 250 and a power control unit 255, which may include logic to perform power management techniques. In addition PCU 255 may include a BIST circuit 256 that is configured to identify a minimum operating voltage for each FPGA programmable logic circuit 212.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Figure 3:
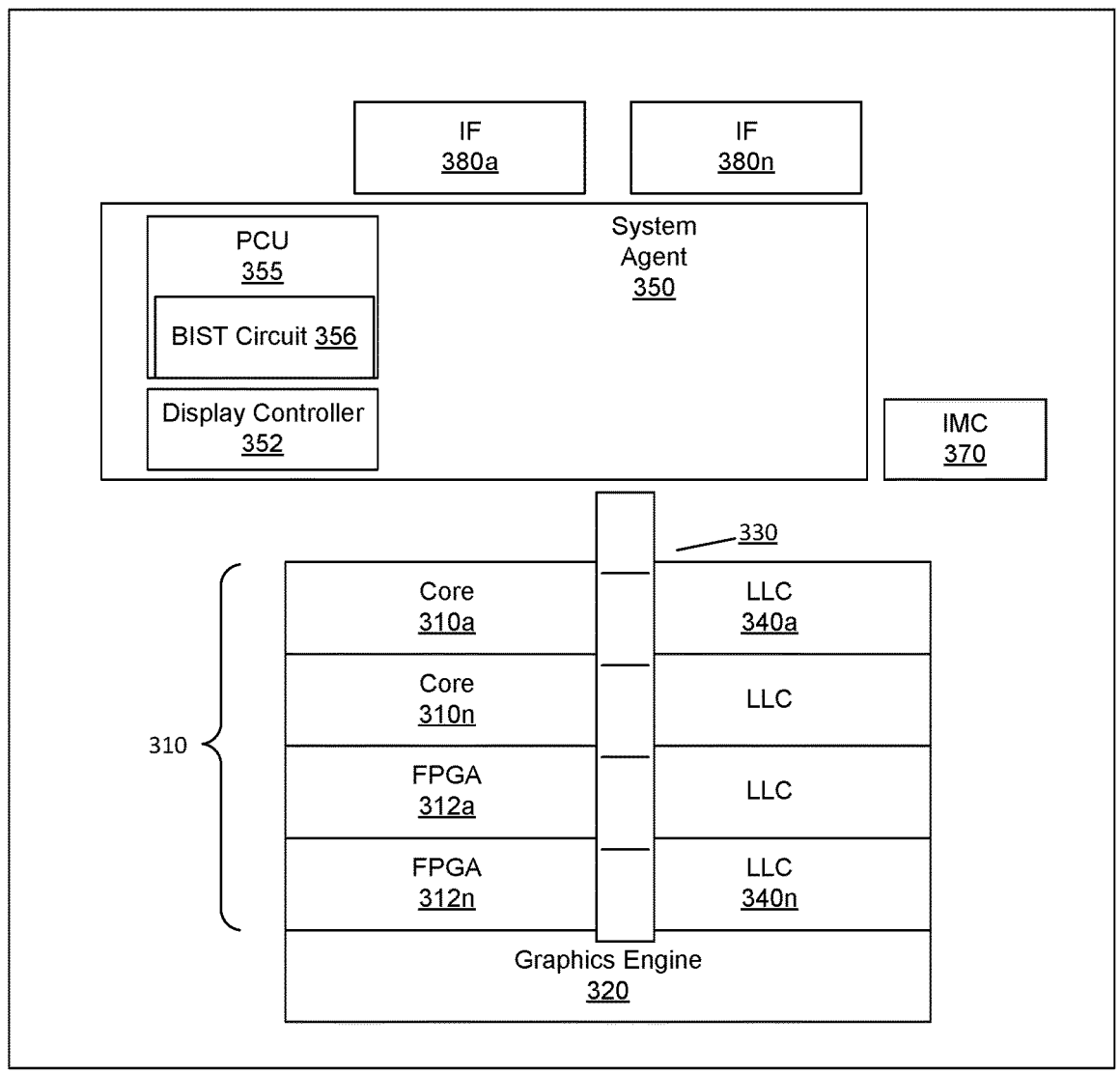
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores 310a-310n, a plurality of FPGA programmable logic circuits $312_a$-$312_n$, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each core 310 may further include low level caches in addition to various execution units and additional processing elements. In turn, the various cores may be coupled to each other and to a shared cache memory formed of a plurality of units of a last level cache (LLC) 340a-340n. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent circuitry 350. In one embodiment, interconnect 330 can be part of the core domain. However in other embodiments the ring interconnect can be of its own domain.

As further seen, system agent domain 350 may include display controller 352 which may provide control of and an interface to an associated display. As further seen, system agent domain 350 may include a power control unit 355 which can include logic to perform power management techniques, including identification of minimum operating voltages as described herein. To this end, PCU 355 includes a BIST circuit 356 that is configured to identify a minimum operating voltage for each FPGA programmable logic circuit 312 as described herein.

As further seen in FIG. 3, processor 300 can further include an integrated memory controller (IMC) 370 that can provide for an interface to a system memory, such as a dynamic random access memory (DRAM). Multiple interfaces 380a-380n may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more QPI interfaces may also be provided. Although shown at this high level in the embodiment of FIG. 3, understand the scope of the present invention is not limited in this regard.

Figure 4:
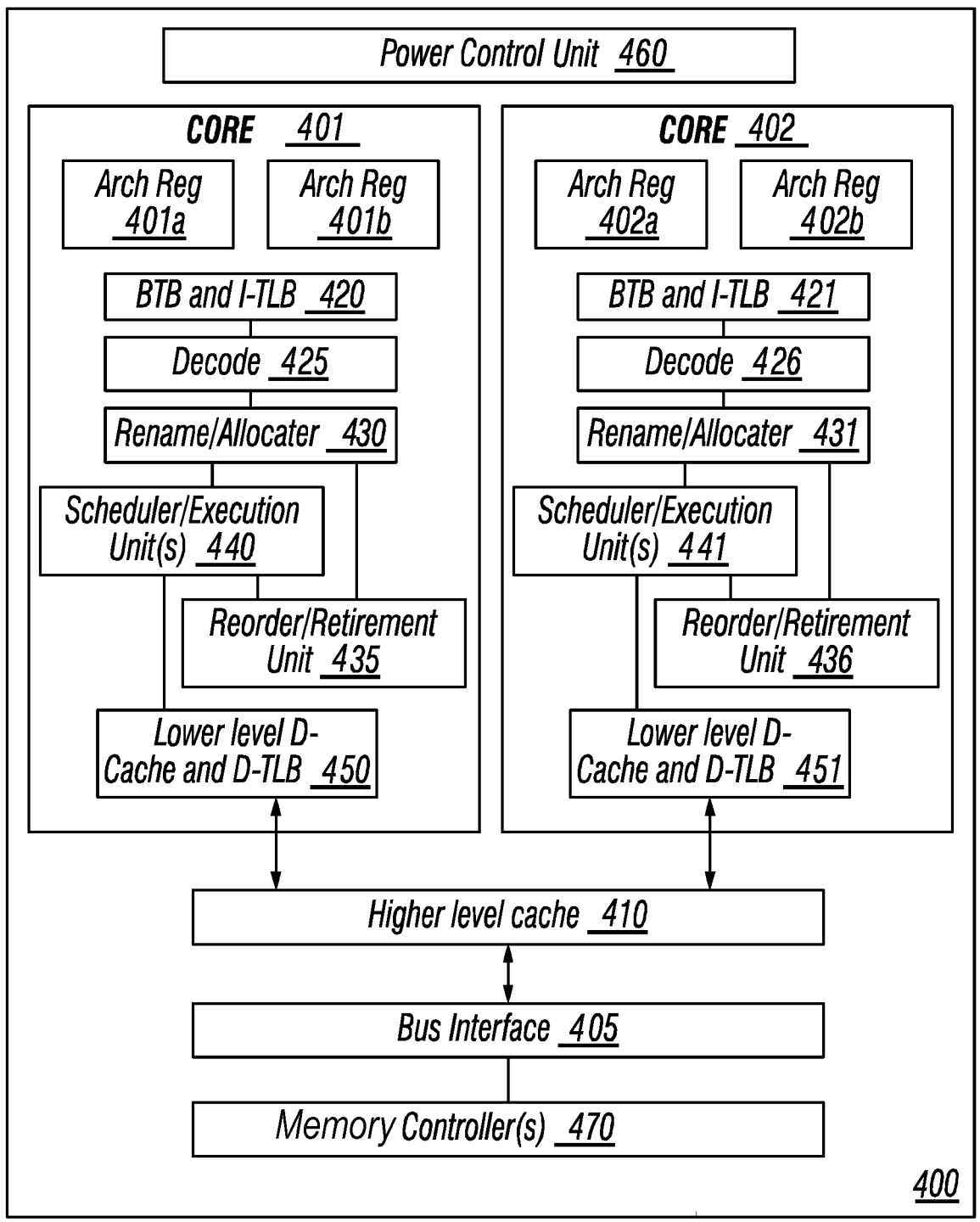
FIG. 4 is an embodiment of a processor including multiple cores.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401a and 401b, which may also be referred to as hardware thread slots 401a and 401b. Therefore, software entities, such as an operating system, in one embodiment potentially view processor 400 as four separate processors, i.e., four logical processors or processing elements capable of executing four software threads concurrently. As alluded to above, a first thread is associated with architecture state registers 401a, a second thread is associated with architecture state registers 401b, a third thread may be associated with architecture state registers 402a, and a fourth thread may be associated with architecture state registers 402b. Here, each of the architecture state registers (401a, 401b, 402a, and 402b) may be referred to as processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, branch target buffer and instruction translation lookaside buffer (BTB and I-TLB) 420, load/store buffers, and queues may be shared through partitioning. Other resources, such as general purpose internal registers, page-table base register(s), low-level data-cache and data-TLB 450, execution unit(s) 440, and portions of out-of-order unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments. The OOO core includes a branch target buffer 420 to predict branches to be executed/taken and an instruction-translation buffer (I-TLB) 420 to store address translation entries for instructions.

Core 401 further includes decode module 425 coupled to a fetch unit to decode fetched elements. Fetch logic, in one embodiment, includes individual sequencers associated with thread slots 401a, 401b, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode logic 425 includes circuitry that recognizes these instructions from their opcodes and passes the decoded instructions on in the pipeline for processing as defined by the first ISA. For example, decoders 425, in one embodiment, include logic designed or adapted to recognize specific instructions, such as transactional instruction. As a result of the recognition by decoders 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401a and 401b are potentially capable of out-of-order execution, where allocator and renamer block 430 also reserves other resources, such as reorder buffers to track instruction results. Unit 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation lookaside buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder 425 to store recently decoded traces.

In the depicted configuration, processor 400 also includes bus interface module 405 and a power control unit 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Figure 5:
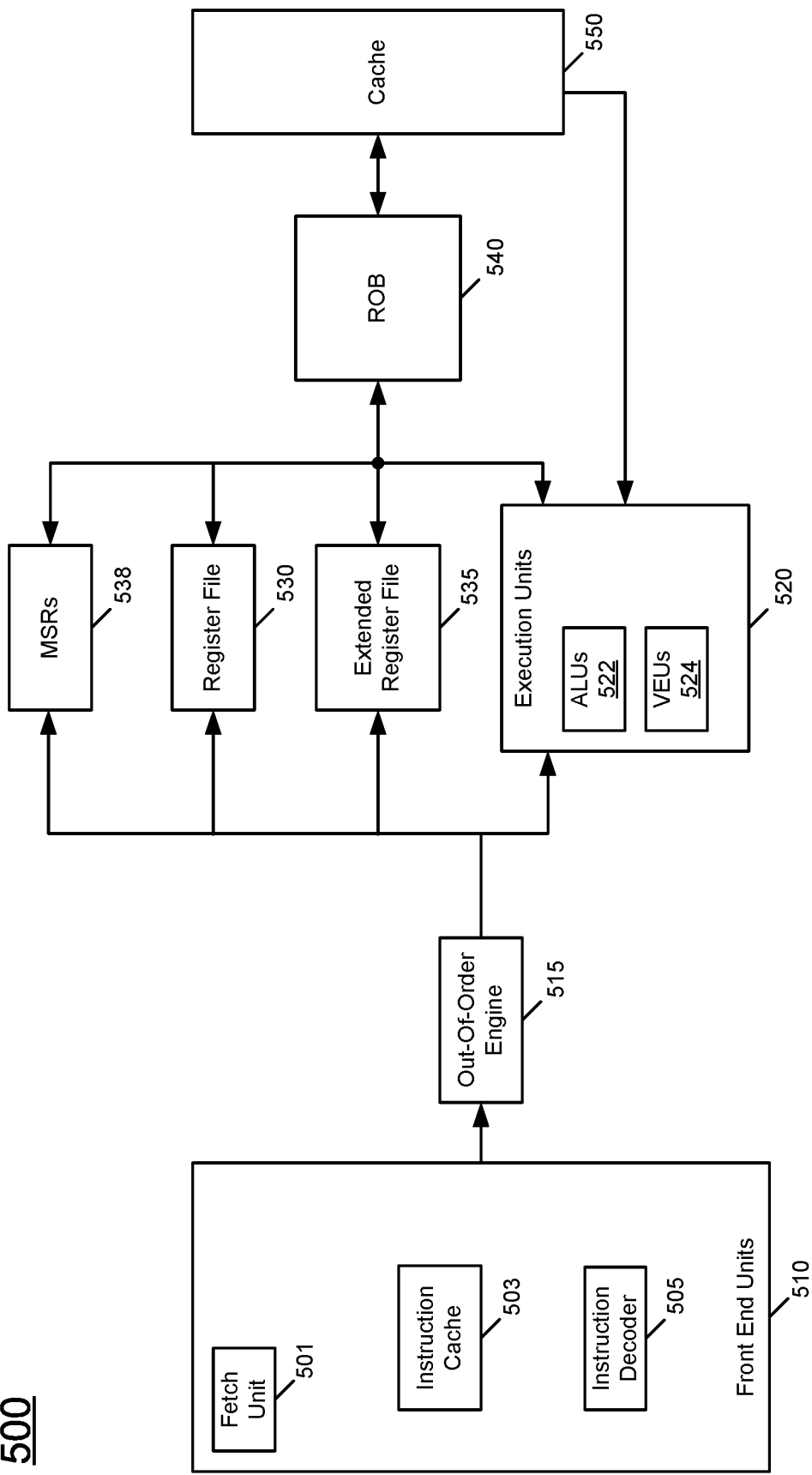
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. For purposes of configuration, control, and additional operations, a set of machine specific registers (MSRs) 538 may also be present and accessible to various logic within core 500 (and external to the core).

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
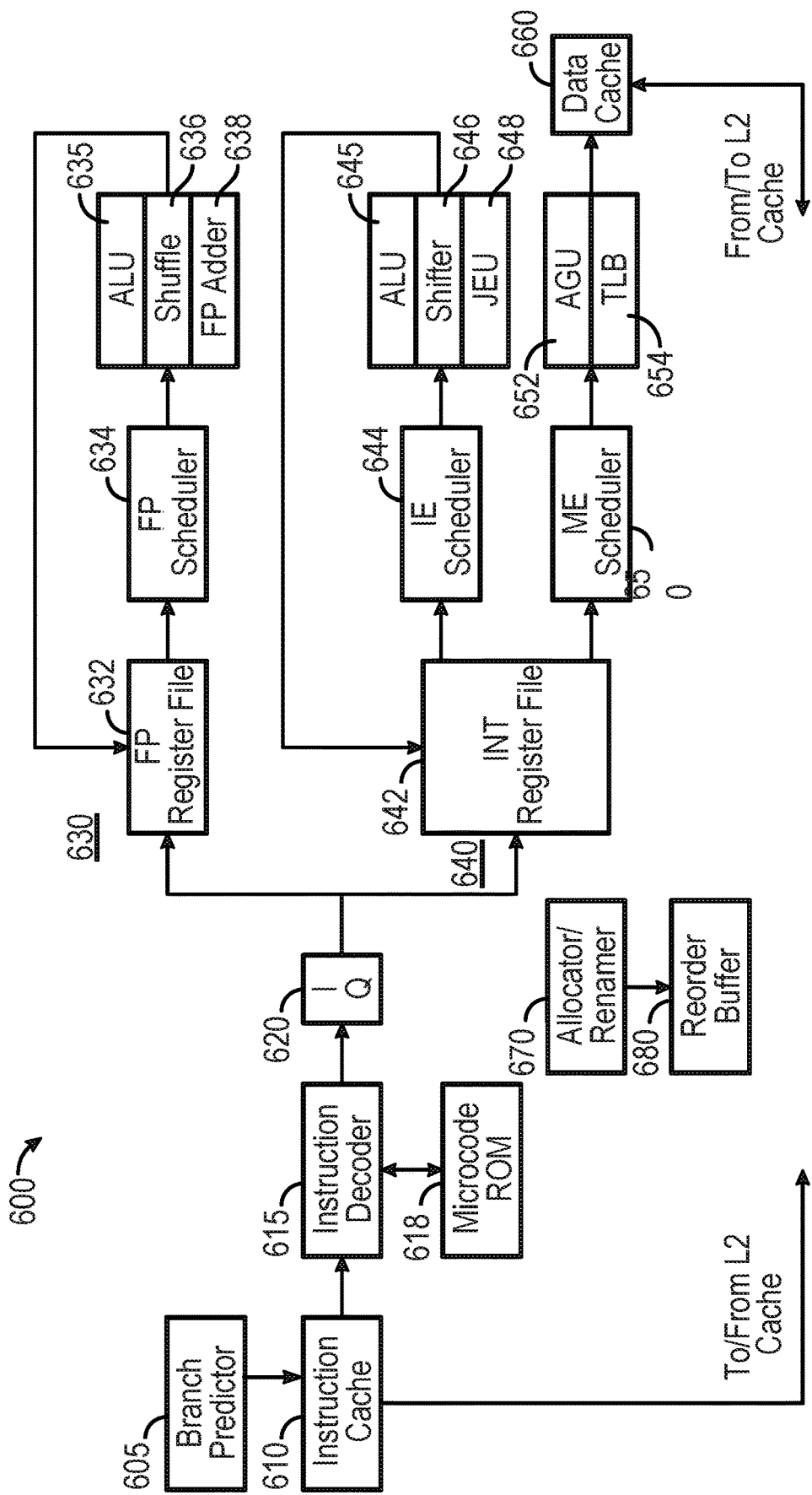
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue (IQ) 620 for storage and delivery to a given execution pipeline. A microcode ROM 618 is coupled to instruction decoder 615.

A floating point pipeline 630 includes a floating point (FP) register file 632 which may include a plurality of architectural registers of a given bit width such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer (INT) register file 642 which may include a plurality of architectural registers of a given bit width such as 128 or 256 bits. Pipeline 640 includes an integer execution (IE) scheduler 644 to schedule instructions for execution on one of multiple execution units of the pipeline. In the embodiment shown, such execution units include an ALU 645, a shifter unit 646, and a jump execution unit (JEU) 648. In turn, results generated in these execution units may be provided back to buffers and/or registers of register file 642. Of course understand while shown with these few example execution units, additional or different integer execution units may be present in another embodiment.

A memory execution (ME) scheduler 650 may schedule memory operations for execution in an address generation unit (AGU) 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
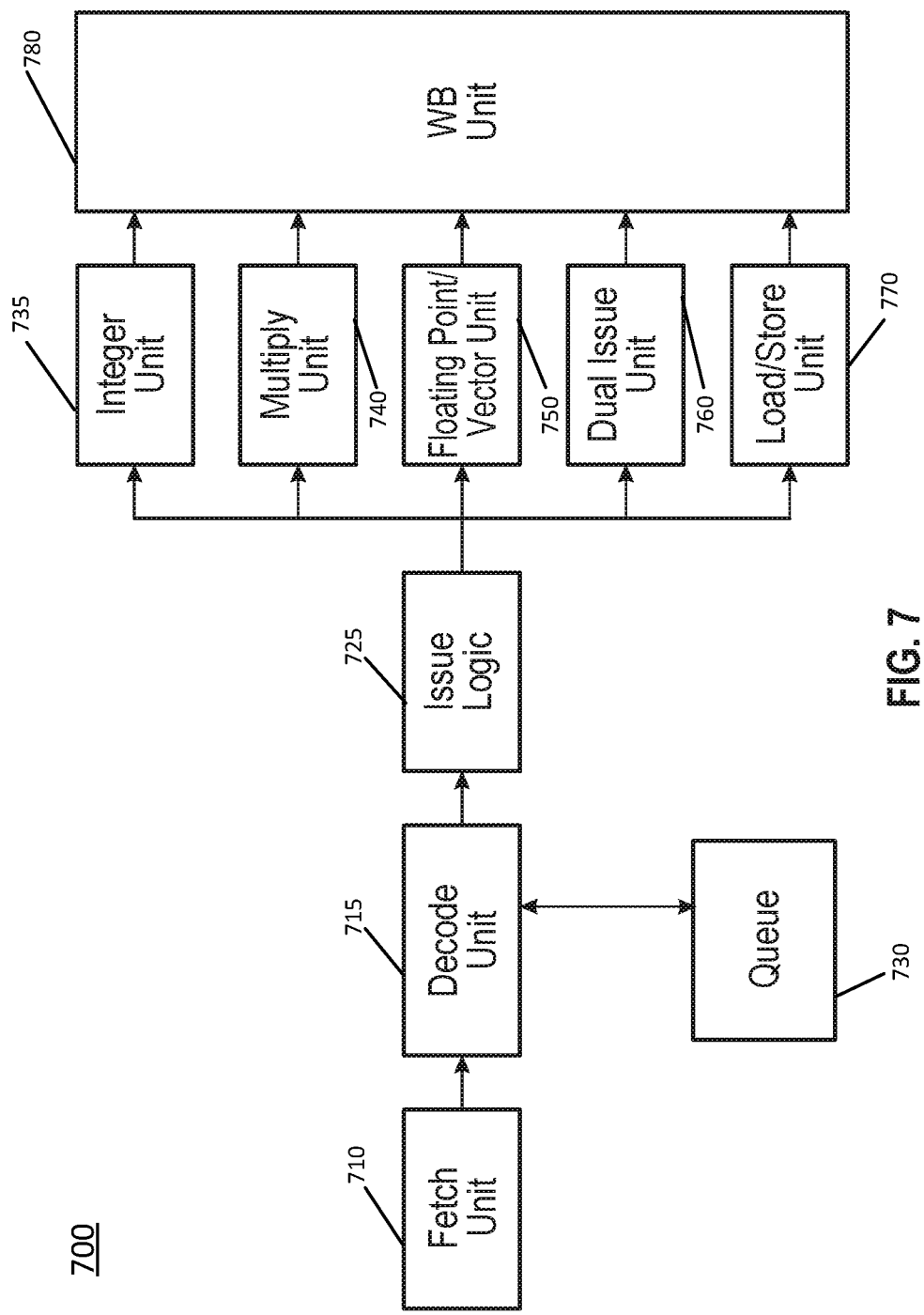
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, processor 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback (WB) unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Figure 8:
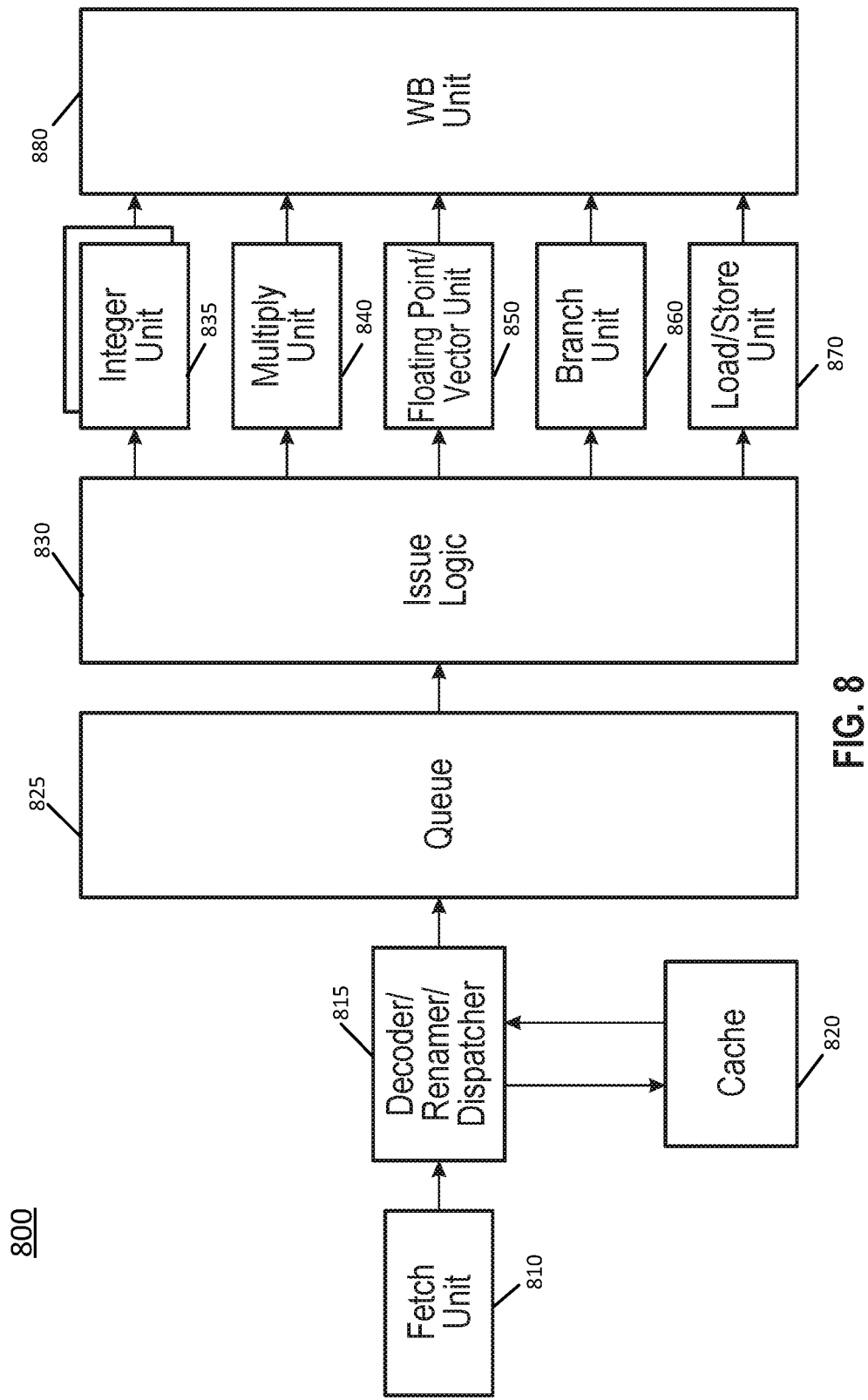
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher unit 815 coupled to a cache 820. Unit 815 may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
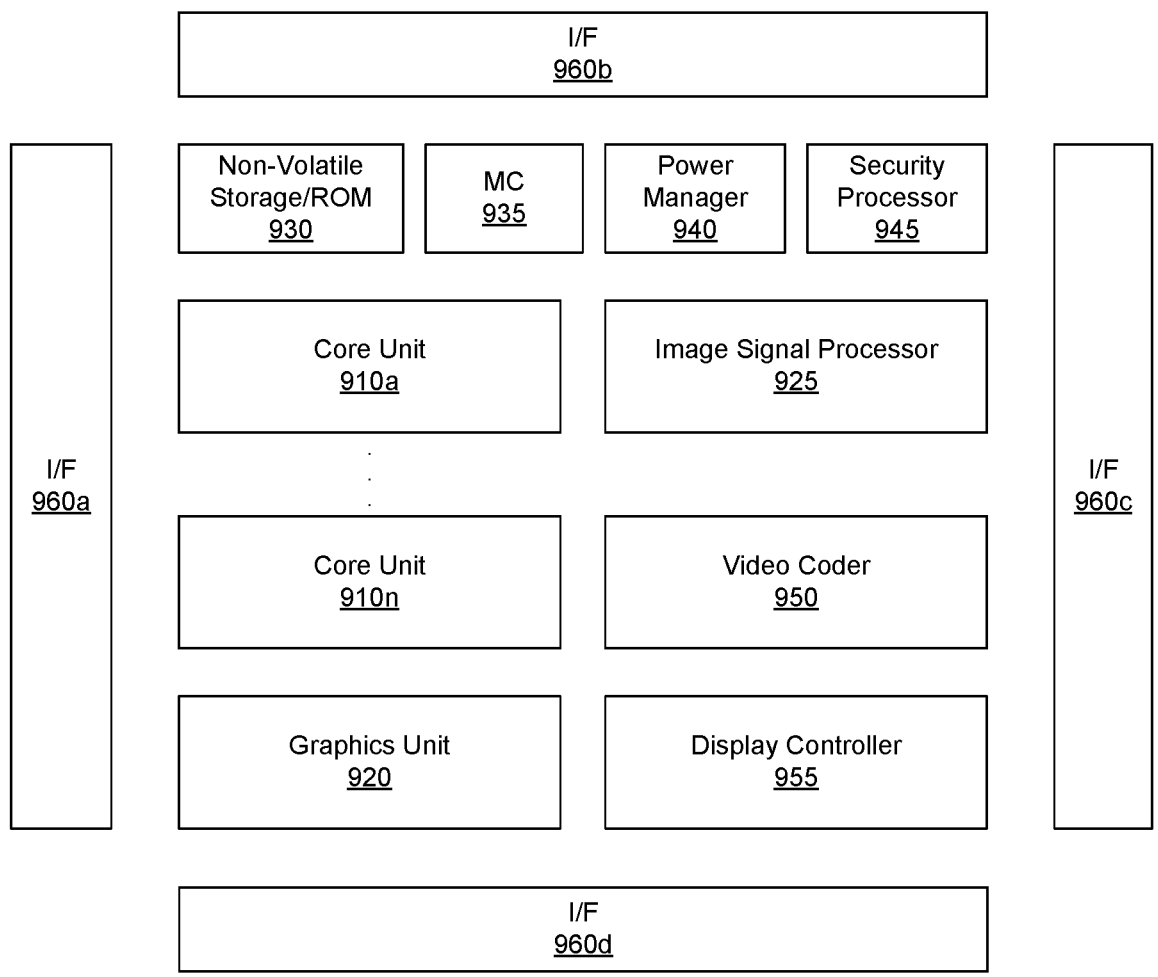
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device, which may incorporate a heterogeneous system architecture having a heterogeneous system architecture-based processor design.

In the high level view shown in FIG. 9, processor 900 includes a plurality of core units 910*a*-910*n*. Each core unit may include one or more processor cores, one or more cache memories and other circuitry. Each core unit 910 may support one or more instruction sets (e.g., an ×86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level two (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, SoC 900 may further include a non-coherent fabric coupled to the coherent fabric to which various peripheral devices may couple. One or more interfaces 960a-960d enable communication with one or more off-chip devices. Such communications may be via a variety of communication protocols such as PCIe™, GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Figure 10:
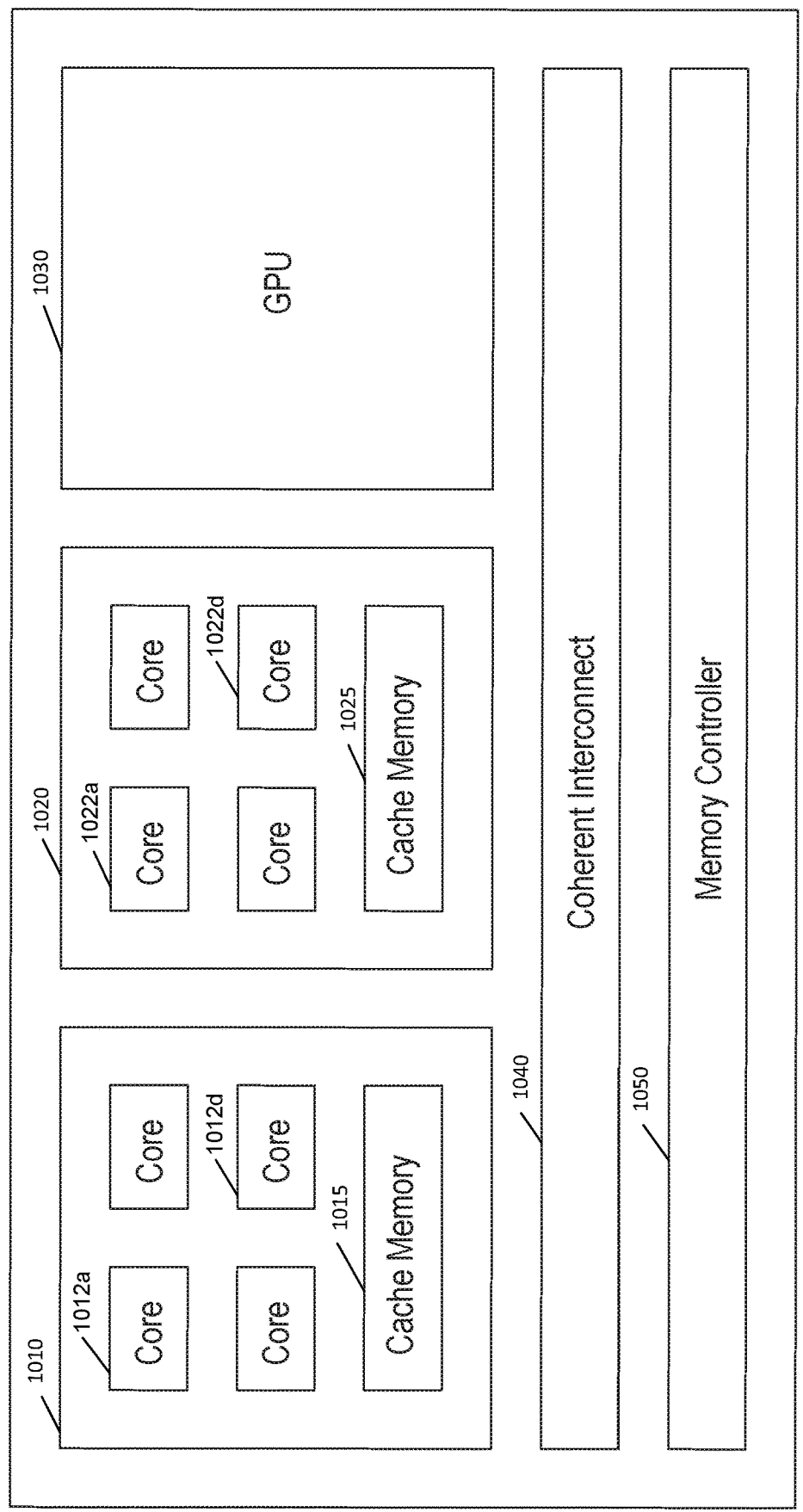
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores and/or one or more FPGA programmable logic circuits. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores 1012a-1012d. In an example, these cores may be low power cores such as in-order cores. In one embodiment these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores 1022a-1022d. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, in some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Figure 11:
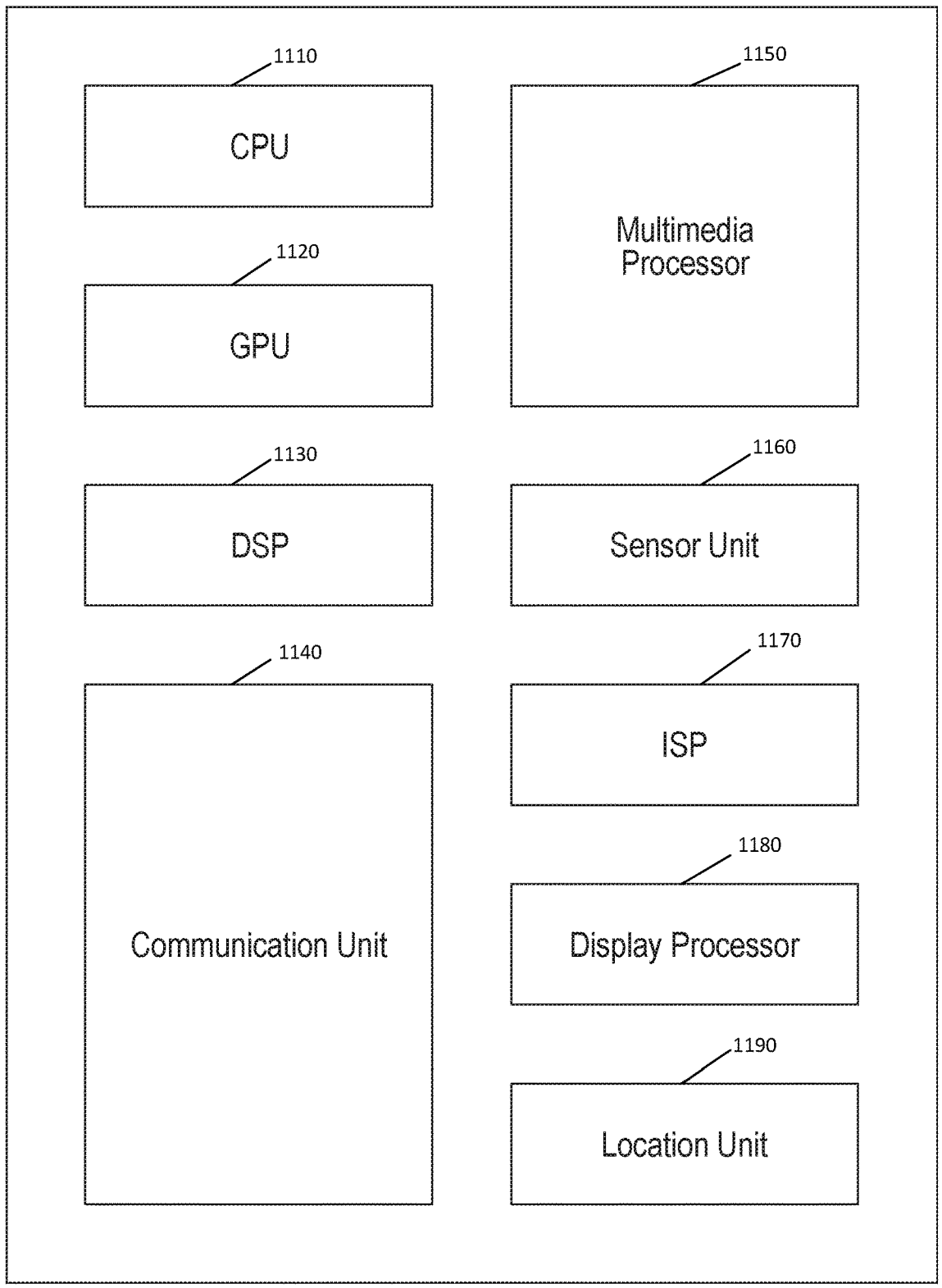
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area protocols such as Bluetooth™, IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Figure 12:
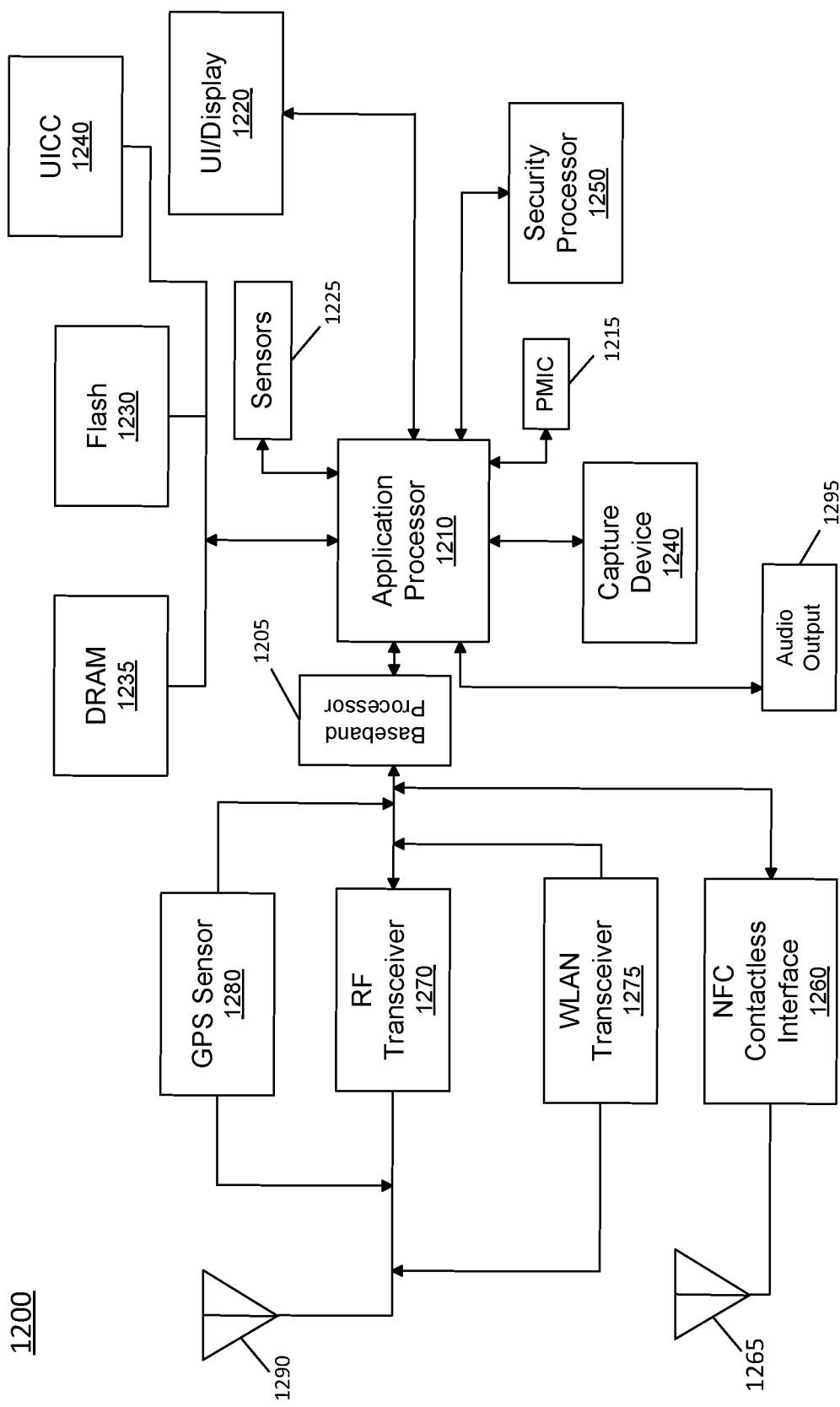
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 12, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications can also be realized.

Figure 13:
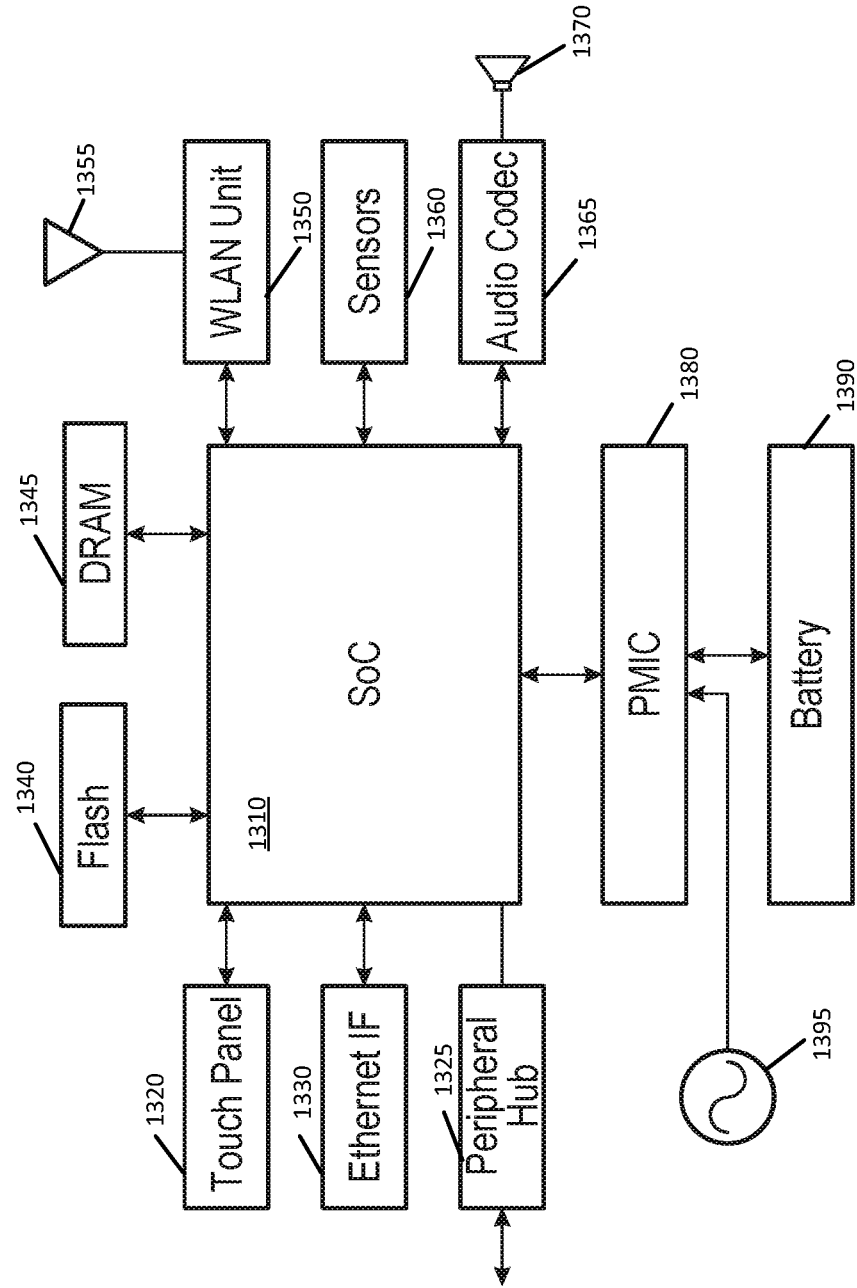
FIG. 13 is a block diagram of another example system with which embodiments may be used.

Referring now to FIG. 13, shown is a block diagram of another example system with which embodiments may be used. In the illustration of FIG. 13, system 1300 may be a mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Figure 14:
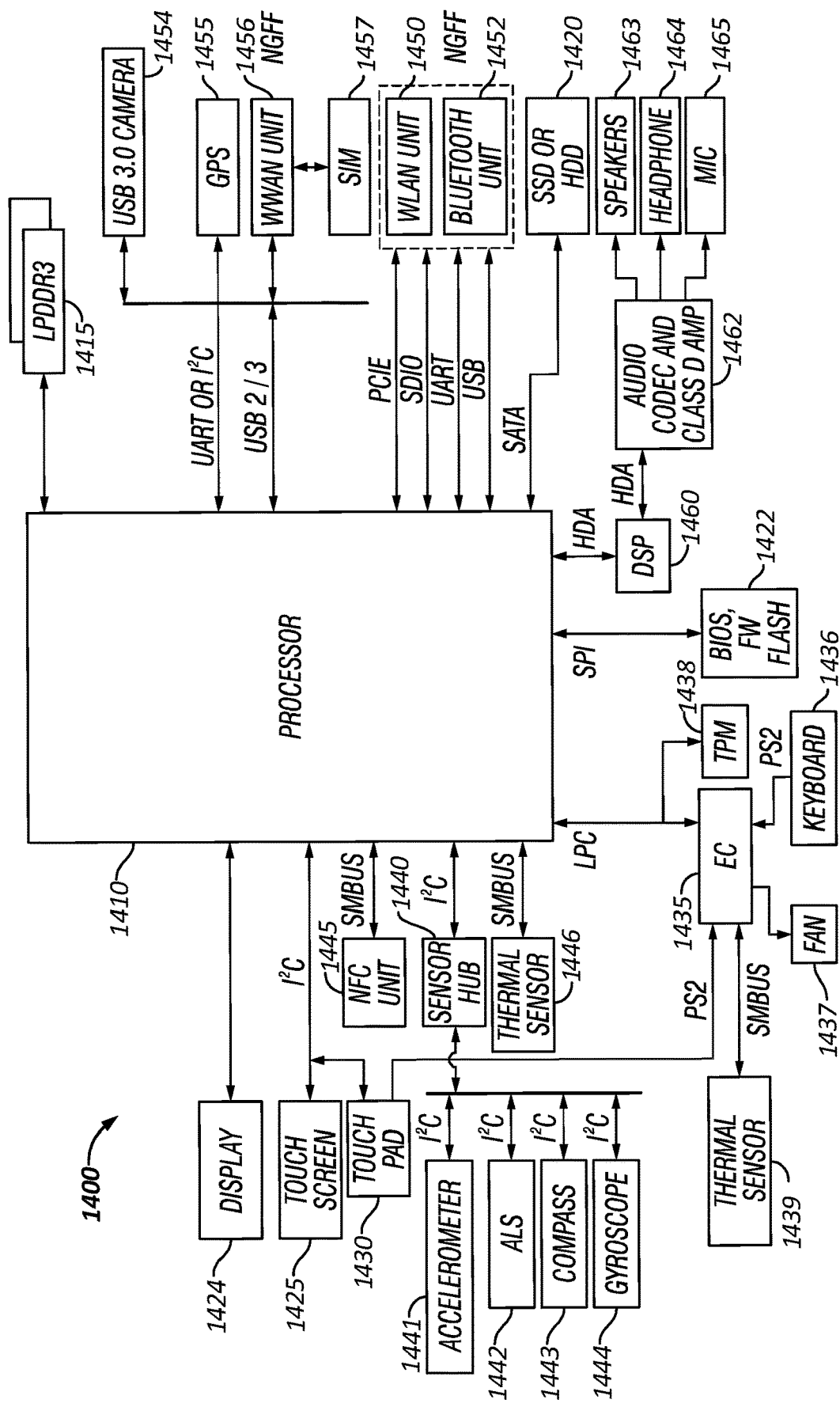
FIG. 14 is a block diagram of a representative computer system.

Referring now to FIG. 14, shown is a block diagram of a representative computer system such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400, and may include power management circuitry as described herein. As one example, processor 1410 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I²C interconnect. As further shown in FIG. 14, in addition to touch screen 1425, user input by way of touch can also occur via a touch pad 1430 which may be configured within the chassis and may also be coupled to the same I²C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I²C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

Also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth™ unit 1452. Using WLAN unit 1450, Wi-Fi™ communications can be realized, while via Bluetooth™ unit 1452, short range Bluetooth™ communications can occur. These units may communicate with processor 1410 via a given link.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given link.

To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Figure 15:
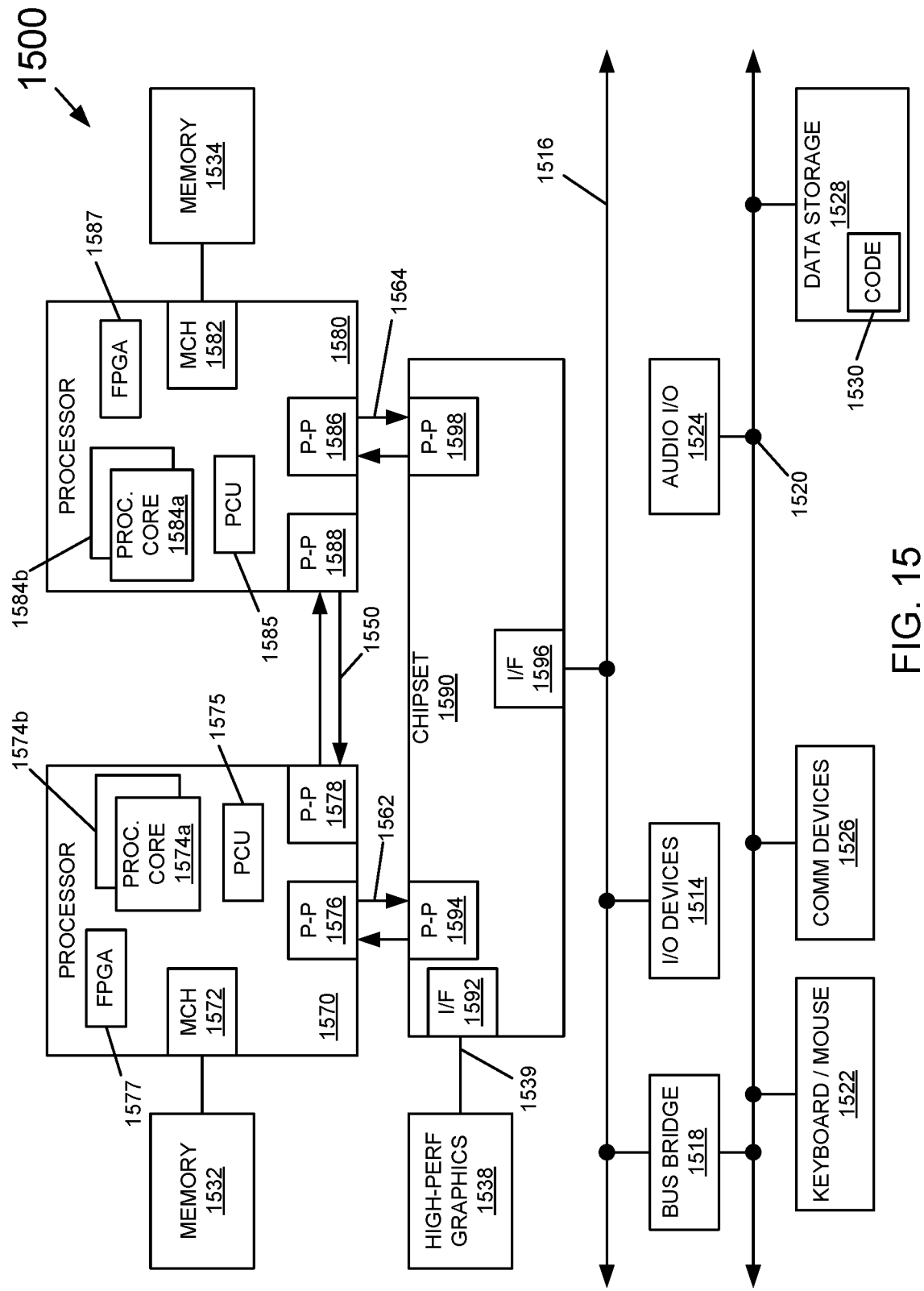
FIG. 15 is a block diagram of a system in accordance with an embodiment of the present invention.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processor cores 1574a and 1574b and processor cores 1584a and 1584b), although potentially many more cores may be present in the processors. In addition, each of the processors may include at least one FPGA programmable logic circuit 1577, 1587. Each of the processors includes a PCU 1575, 1585 or other power management logic to perform processor-based power management, including the dynamic identification of a minimum operating voltage to be applied to each FPGA programmable logic function based at least in part on self-testing performed on a critical path length of a function, as described herein.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 16:
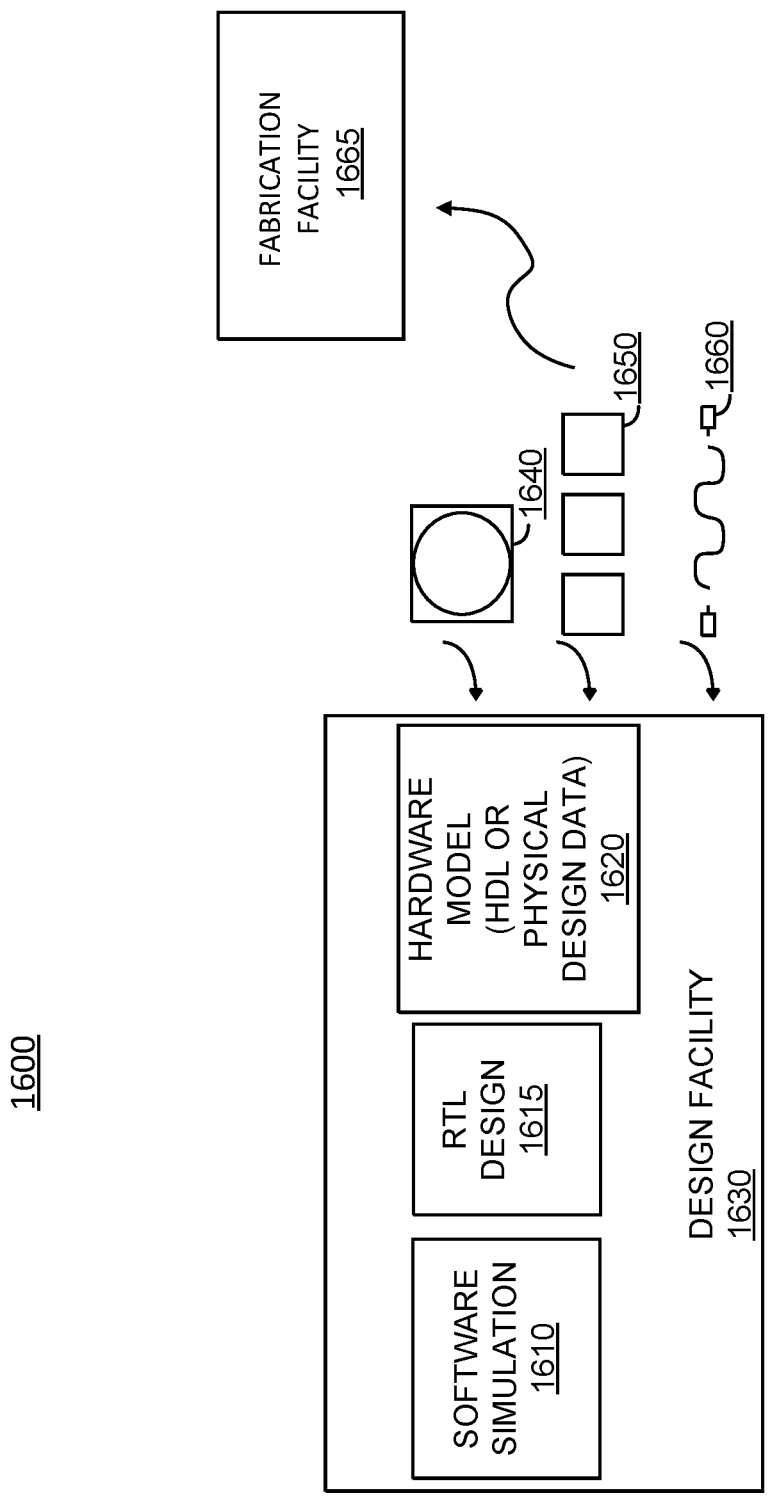
FIG. 16 is a block diagram illustrating an IP core development system used to manufacture an integrated circuit to perform operations according to an embodiment.

FIG. 16 is a block diagram illustrating an IP core development system 1600 that may be used to manufacture an integrated circuit to perform operations according to an embodiment. The IP core development system 1600 may be used to generate modular, re-usable designs that can be incorporated into a larger design or used to construct an entire integrated circuit (e.g., an SoC integrated circuit). A design facility 1630 can generate a software simulation 1610 of an IP core design in a high level programming language (e.g., C/C++). The software simulation 1610 can be used to design, test, and verify the behavior of the IP core. A register transfer level (RTL) design can then be created or synthesized from the simulation model. The RTL design 1615 is an abstraction of the behavior of the integrated circuit that models the flow of digital signals between hardware registers, including the associated logic performed using the modeled digital signals. In addition to an RTL design 1615, lower-level designs at the logic level or transistor level may also be created, designed, or synthesized. Thus, the particular details of the initial design and simulation may vary.

The RTL design 1615 or equivalent may be further synthesized by the design facility into a hardware model 1620, which may be in a hardware description language (HDL), or some other representation of physical design data. The HDL may be further simulated or tested to verify the IP core design. The IP core design can be stored for delivery to a third party fabrication facility 1665 using non-volatile memory 1640 (e.g., hard disk, flash memory, or any non-volatile storage medium). Alternately, the IP core design may be transmitted (e.g., via the Internet) over a wired connection 1650 or wireless connection 1660. The fabrication facility 1665 may then fabricate an integrated circuit that is based at least in part on the IP core design. The fabricated integrated circuit can be configured to perform operations in accordance with at least one embodiment described herein.

Figure 17:
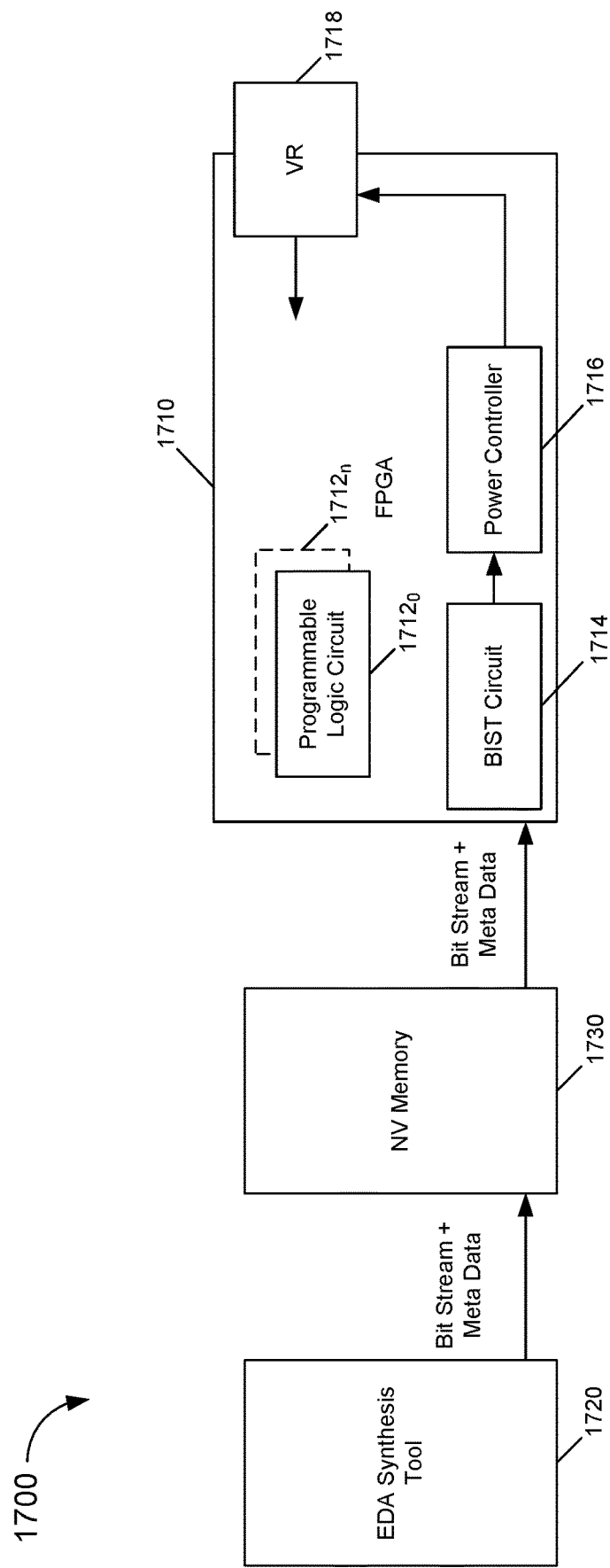
FIG. 17 is a block diagram of a system in accordance with an embodiment.

Referring now to FIG. 17, shown is a block diagram of a system in accordance with an embodiment. System 1700 may be any type of computing system, ranging from small device to large-scale server computer. In the particular embodiment shown, system 1700 provides an environment for generating a bitstream to provide one or more programmable logic functions to be implemented within a field programmable gate array. To this end, system 1700 includes an EDA synthesis tool 1720. Using embodiments described herein, synthesis tool 1720 may generate one or more bitstreams that provide a programmable function, along with metadata to be used to dynamically control operating voltage of a particular FPGA based on a priori knowledge of the programmable logic function(s) to be executed within the particular FPGA. As illustrated, synthesis tool 1720 provides this bitstream along with associated metadata to a non-volatile memory 1730. In embodiments, non-volatile memory 1730 may be implemented as flash memory.

During normal system operation (in the absence of synthesis tool 1720, such as where FPGA 1710 is implemented in the field) and more particularly during boot activities, one or more bitstreams and metadata may be downloaded to FPGA 1710. This bitstream as downloaded may be used to program one or more programmable logic circuits $1712_0$-$1712_N$. In turn, the metadata may include information used for performing dynamic characterization self-testing within FPGA 1710, to identify an appropriate operating voltage at which FPGA 1710 may operate. Such self-testing may be used to identify and dynamically test one or more critical path functions within programmable logic circuits 1712, to identify an appropriate operating voltage. Upon completion of such dynamic diagnostic self-testing, operating parameters including a minimum operating voltage can be identified and stored locally for use during normal operation.

Still with reference to FIG. 17, FPGA 1710 includes a built-in self-test (BIST) circuit 1714 (also referred to herein as a "self-test circuit"). In embodiments herein, BIST circuit 1714 may, based upon information within the metadata, perform diagnostic self-testing as described herein to identify one or more appropriate operating voltages. In turn, such identified operating voltage(s) can be provided to a power controller 1716, which may in turn control a voltage regulator 1718 to provide such operating voltage(s) to various circuitry of FPGA 1710, including one or more programmable logic circuits 1712. In embodiments, voltage regulator 1718 may be an internal or external voltage regulator. In an embodiment, power controller 1716 may control voltage regulator 1718 according to a determined minimum operating voltage obtained via a Vm in search executed by BIST circuit 1714, and maintain this same voltage level until a next boot sequence. While the embodiment of FIG. 17 shows a hardware embodiment of self-test circuit 1714, understand that other implementations are possible. In an embodiment, self-test circuit 1714 may execute during a boot routine to perform a VMIN search using a predefined model for the specific FPGA configuration to identify an optimal minimum voltage. This offline generated metadata may enable faster and more accurate modeling of the specific scenario.

While the embodiment of FIG. 17 shows a standalone FPGA, understand that embodiments are not limited in this regard. For example, in other embodiments a single integrated circuit may include a combination of FPGA and SoC on the same die or on multiple die in the same package. Although shown at this high level in the embodiment of FIG. 17, many variations and alternatives are possible.

Figure 18:
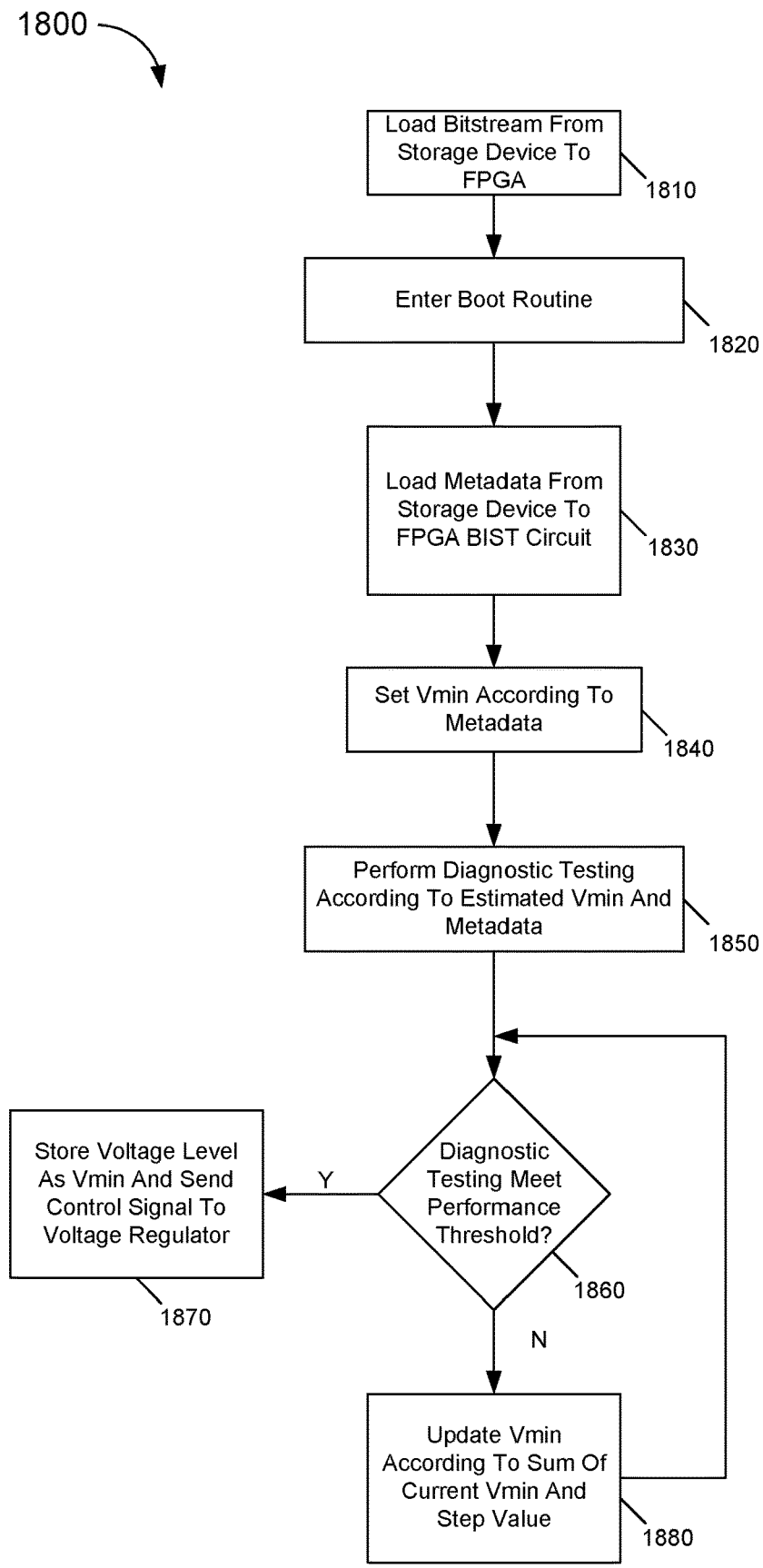
FIG. 18 is a flow diagram of a method in accordance with an embodiment of the invention.

Referring now to FIG. 18, shown is a flow diagram of a method in accordance with an embodiment of the invention. As shown in FIG. 18, method 1800 may be performed by circuitry within a FPGA to identify one or more minimum operating voltages at which programmable logic circuitry of the FPGA is to operate during normal operation. Method 1800 can be performed upon restarting a system including at least one FPGA. At block 1810, a bitstream is loaded from a storage device to the FPGA. More specifically, the bitstream may be loaded from a source device, such as a given non-volatile memory system, to the FPGA. Thereafter, at block 1820 a boot routine is entered to perform startup activities within the FPGA.

Still referring to FIG. 18, next control passes to block 1830 where metadata may be loaded from the storage device. More specifically, this metadata, which may include one or more diagnostic self-test tests and an estimated minimum operating voltage, may be loaded from the storage device to a BIST circuit of the FPGA. Next, control passes to block 1840 where, e.g., the BIST circuit may communicate the estimated minimum operating voltage to a power controller to cause the power controller to set an operating voltage to this estimated minimum operating voltage value, e.g., via communication to one or more voltage regulators.

At this point, the FPGA is fully configured to perform diagnostic self-testing. Accordingly, control passes to block 1850 where diagnostic testing is performed according to the estimated minimum voltage and metadata that may include one or more sets of diagnostic self-tests to fully exercise one or more critical logic paths of the programmable logic circuitry. Note that in some cases a power controller of the FPGA can read metadata including a given operating frequency and voltage and may trigger exercising of logic within the FPGA to perform the BIST functionality, in addition to controlling a voltage regulator using the metadata. Also note that in different embodiments, the critical path length of the function can be a special circuit or a given functional circuit of the FPGA to be accessed during the self-test. For example if the FPGA critical circuit is a multiplier, it is possible to activate this multiplier at BIST using DFT logic to test it in place and then, at run-time, to use this same multiplier.

Next, at the conclusion of the diagnostic self-testing it is determined at diamond 1860 whether this self-testing meets a performance threshold. For example, it can be determined whether a test result calculated during operation of the self-testing meets an expected test result. Or it can be determined whether the self-testing meets appropriate operating criteria, such as instruction execution rate or so forth. If it is determined that the testing meets such one or more performance thresholds, control passes to block 1870 where the voltage level is stored as a minimum operating voltage value, e.g., in a given configuration storage. Furthermore, a control signal may be sent to or more voltage regulators to cause the one or more voltage regulators to operate at this operating voltage.

Note that if the diagnostic testing does not meet the performance threshold, control instead passes from diamond 1860 to block 1880. There the given minimum voltage at which the diagnostic self-testing was performed may be updated, e.g., by some step value. In an embodiment, the step value may be a predetermined step value, e.g., between approximately 5 and 50 millivolts. Thereafter, control passes back to block 1850 for further diagnostic self-testing. While shown at this high level in the embodiment of FIG. 18, many variations and alternatives are possible. For example, in cases where there are multiple programmable logic circuits each to execute at least one logic function, the flow of method 1800 may be performed iteratively to identify independent minimum operating voltages for each such circuit. In this way, a single FPGA may operate such at different programmable logic circuits can concurrently execute at independent voltages.

With this minimum voltage, a lower voltage guard band can be applied based on dice manufacturing statistical variation parameters and further based on real-time in-field testing. As such, embodiments provide a single part solution that can deliver reduced power consumption over a wide spectrum of potential frequencies, to provide a user with great flexibility for a wide range of design configurations. In contrast, conventional FPGAs simply use a single predefined modeling of voltage to frequency that fits the specific design architecture and worst case critical path. In such conventional FPGAs, while voltage may change for lower frequencies as characterized by the predefined curve, there is no ability to adjust voltage for a particular configuration of the FPGA.

By using an embodiment, a plurality of predefined models of voltage to frequency are supported. In addition, variation from any one of these models can be accommodated based on actual device testing using a self-test circuit as described herein.

Figure 19:
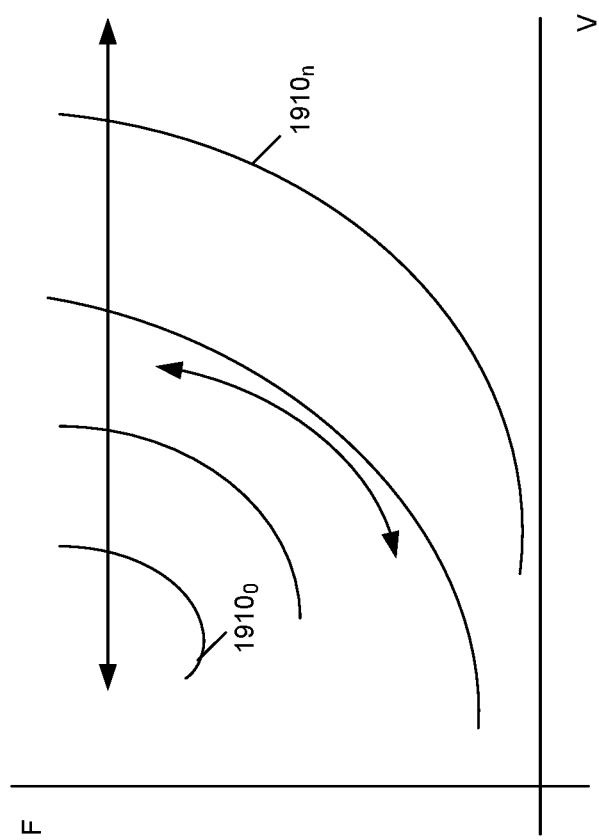
FIG. 19 is a graphical illustration of voltage-frequency curves in accordance with an embodiment.

Referring now to FIG. 19, shown is a graphical illustration of voltage-frequency curves in accordance with an embodiment. As shown in the 19, illustration 1900 provides multiple voltage-frequency curves $1910_0$-$1910_n$. In an embodiment as described herein, a single FPGA may be programmably controlled, e.g., based at least in part on one or more functions to be executed on one or more programmable logic circuits of the FPGA, to operate at an operating point associated with one or more of voltage-frequency curves 1910. In this way, with multiple models as in FIG. 19, a given FPGA can operate dynamically according to different ones of these models depending on a specific design logic configuration.

Figure 20:
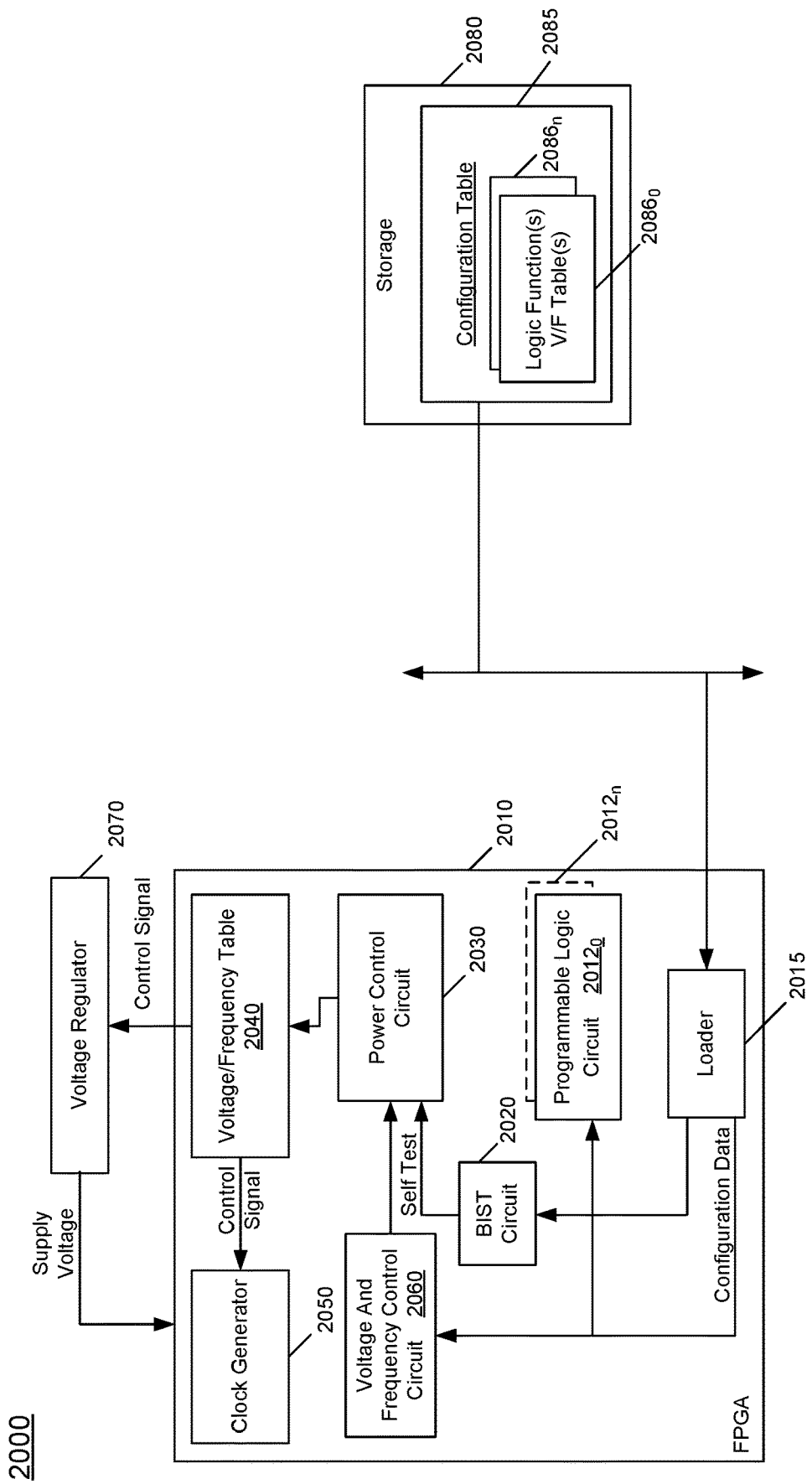
FIG. 20 is a block diagram of a system in accordance with another embodiment of the present invention.

Referring now to FIG. 20, shown is a block diagram of a system in accordance with another embodiment of the present invention. More specifically, FIG. 20 shows a computing system 2000 that includes an FPGA 2010 that is programmably controlled to perform one or more logical functions. Furthermore, as described herein FPGA 2010 may be controlled to operating at an individual, dynamically determined minimum operating voltage (or multiple independent minimum operating voltages) sufficient to ensure correct execution of the one or more logical functions. To this end, FPGA 2010 couples to a storage 2080, which may be any type of non-volatile storage. While various information is stored in such storage, of interest here storage 2080 includes a configuration table 2085 to store various configuration information which may be downloaded to FPGA 2010 during power on and normal operations within system 2000. To enable FPGA 2010 to perform one or more programmable logic functions, a plurality of embedded bitstreams $2086_0$-$2086_N$ may be stored within configuration table 2085. While various information is present within such bitstreams, of interest here each bitstream 2086 may include one or more logical functions and metadata. Such metadata may include one or more voltage/frequency tables that provide estimated values of voltage/frequency for the corresponding logic functions. FPGA 2010 may use such estimated voltage information within these V/F tables to enable a dynamic determination of appropriate minimum operating voltage at which the corresponding logic function may operate during normal operation. To this end, bitstreams 2086 may further include one or more self-tests to enable the determination of the minimum operating voltage. Understand while this embodiment contemplates the bitstreams themselves to include metadata, in other cases the metadata, while associated with a given bitstream may be stored, accessed and downloaded separately.

As seen, FPGA 2010 also includes a loader 2015. Loader 2015 may be a boot loader or other controller that receives incoming bitstreams and corresponding metadata. Loader 2015 may use incoming bitstreams to program logic functions within logic circuitry $2012_0$-$2012_N$. In turn, metadata within the associated bitstream may be used to cause BIST circuit 2020 to perform self-testing of the programmable logic circuits 2012. Loader 2015 may further receive and communicate configuration data to a voltage and frequency control circuit 2060. Control circuit 2060 may issue control signals to a power control circuit 2030 that in turn is used to initiate control signals communicated by way of a voltage/frequency table 2040 to cause one or more operating frequencies to be generated within a clock generator 2050. In addition, similar control signals may be provided to a voltage regulator 2070 (shown as an external voltage regulator in this embodiment) to cause one or more operating voltages to be generated and provided to FPGA 2010.

In various embodiments, an EDA synthesis tool may be configured to generate metadata associated with a given bitstream. This metadata may include a variety of information, including a critical path length that is to be exercised by a self-test circuit to determine specific design constraints. This metadata may be stored in association with a corresponding bitstream in a non-volatile storage for download to the FPGA on boot. While booting, the metadata stored in the storage is transferred to the FPGA and more specifically to a self-test unit. In turn, the bitstream is sent to a fabric of the FPGA to configure the FPGA logic elements to the specific design configuration.

Embodiments may thus enable reduced power consumption for FPGA standalone devices and/or systems on chip or other subsystems that include a central processing unit (CPU) (e.g., including one or more general-purpose processing cores) and one or more accelerators implemented as FPGAs.

The following examples pertain to further embodiments.

In one example, an apparatus comprises a FPGA that includes: at least one programmable logic circuit to execute a function programmed with a bitstream; a self-test circuit to execute a self-test at a first voltage, the self-test and the first voltage programmed with first metadata associated with the bitstream, the self-test including at least one critical path length of the function; and a power controller to identify an operating voltage for the at least one programmable logic circuit based at least in part on the execution of the self-test at the first voltage.

In an example, the first voltage comprises an estimated minimum voltage at which the function is to correctly execute.

In an example, the estimated minimum voltage is based on a synthesis tool determination of the at least one critical path length of the function.

In an example, the power controller is to send a voltage command to a voltage regulator to cause the voltage regulator to provide the operating voltage to the at least one programmable logic circuit.

In an example, the power controller is to identify the first voltage to be the operating voltage in response to the execution of the self-test meeting of a performance threshold.

In an example, in response to the execution of the self-test at the first voltage not meeting the performance threshold, the power controller is to increase the first voltage to a second voltage and cause the self-test circuit to execute the self-test at the second voltage.

In an example, the apparatus further comprises a non-volatile memory coupled to the FPGA, the non-volatile memory to store the bitstream and the first metadata, where on power up of the FPGA, the non-volatile memory is to provide the bitstream and the first metadata to the FPGA to cause the at least one programmable logic circuit to be programmed for the function.

In an example, the operating voltage comprises a minimum voltage, the minimum voltage sufficient to support the at least one critical path length at an operating frequency for the function and further based on a process variation of the FPGA.

In an example, the minimum voltage is lower than a worst case minimum voltage for the FPGA based on a fastest supported frequency and a slowest process variation.

In an example, the FPGA comprises a plurality of programmable logic circuits, each programmable logic circuit to execute one of a plurality of functions programmed with one of a plurality of bitstreams.

In an example, at least some of the plurality of programmable logic circuits are to operate at independent voltages based on self-testing performed by the self-test circuit for the corresponding programmable logic circuit and function.

In an example, the apparatus comprises a system on chip including the FPGA and one or more processor cores of a central processing unit.

In an example, the apparatus further comprises a semiconductor die including the FPGA and the central processing unit.

In another example, a method comprises: receiving, in a FPGA having at least one programmable logic circuit, a bitstream and metadata associated with the bitstream; programming the at least one programmable logic circuit with the bitstream to enable the at least one programmable logic circuit to execute a function; executing at least one self-test for the function in the FPGA at a first voltage, the metadata to identify the at least one self-test and the first voltage; determining if the execution of the at least one self-test meets a performance threshold; and causing the FPGA to operate at the first voltage in response to determining that the execution of the at least one self-test meets the performance threshold.

In an example, the method further comprises executing the at least one self-test for the function in the FPGA at a second voltage in response to determining that the execution of the at least one self-test does not meet the performance threshold, the second voltage greater than the first voltage.

In an example, the first voltage comprises an estimated minimum operating voltage to execute the function and the second voltage comprises a sum of the estimated minimum operating voltage and a step value.

In an example, the method further comprises executing the at least one self-test via a self-test circuit of the FPGA, the self-test circuit programmed with at least a portion of the metadata.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In another example, an apparatus comprises: a system on chip including at least one core and at least one FPGA. The at least one FPGA may include: a plurality of programmable logic circuits each to execute a function programmed with a corresponding bitstream; at least one self-test circuit to execute one or more self-tests at one or more first voltages, the at least one self-test circuit to be programmed with metadata associated with the corresponding bitstream; and a power controller to identify a minimum operating voltage for the plurality of programmable logic circuits based on the execution of the one or more self-tests.

In an example, the apparatus comprises a semiconductor die including the at least one core and the at least one FPGA.

In an example, the apparatus further comprises a non-volatile storage coupled to the at least one FPGA, the non-volatile storage to store the corresponding bitstream and the metadata, and where the first voltage comprises an estimated minimum voltage at which the function is to correctly execute.

In another example, an apparatus for controlling a voltage of a FPGA comprises: means for receiving a bitstream and metadata associated with the bitstream; means for programming at least one programmable logic means of the FPGA with the bitstream to enable the at least one programmable logic means to execute a function; means for executing at least one self-test for the function in the FPGA at a first voltage, the metadata to identify the at least one self-test and the first voltage; means for determining if the execution of the at least one self-test meets a performance threshold; and means for causing the at least one programmable logic means of the FPGA to operate at the first voltage in response to determining that the execution of the at least one self-test meets the performance threshold.

In an example, the apparatus further comprises means for executing the at least one self-test for the function in the FPGA at a second voltage in response to determining that the execution of the at least one self-test does not meet the performance threshold, the second voltage greater than the first voltage.

In an example, the first voltage comprises an estimated minimum operating voltage to execute the function and the second voltage comprises a sum of the estimated minimum operating voltage and a step value.

In an example, the apparatus further comprises means for programming a self-test means of the FPGA with at least a portion of the metadata.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
  a field programmable gate array (FPGA) including:
    at least one programmable logic circuit to execute a function programmed with a bitstream;
    a self-test circuit to execute a self-test at a first operating voltage, the self- test and the first operating voltage programmed with first metadata associated with the bitstream, the self-test to identify and dynamically test at least one critical path length of the function; and
    a power controller to identify an operating voltage for the at least one programmable logic circuit based at least in part on the execution of the self-test at the first operating voltage.

2. The apparatus of claim 1, wherein the first metadata comprises a value of the first operating voltage comprising an estimated minimum voltage at which the function is to execute to meet a performance threshold.

3. The apparatus of claim 1, wherein the power controller is to send a voltage command to a voltage regulator to cause the voltage regulator to provide the operating voltage to the at least one programmable logic circuit.

4. The apparatus of claim 1, wherein the power controller is to:
  identify the first operating voltage to be the operating voltage in response to the execution of the self-test meeting of a performance threshold; and
  in response to the execution of the self-test at the first operating voltage not meeting the performance threshold, increase the first operating voltage to a second operating voltage and cause the self-test circuit to execute the self-test at the second operating voltage.

5. The apparatus of claim 1, wherein the apparatus further comprises a non-volatile memory coupled to the FPGA, the non-volatile memory to store the bitstream and the first metadata, wherein on power up of the FPGA, the non-volatile memory is to provide the bitstream and the first metadata to the FPGA to cause the at least one programmable logic circuit to be programmed for the function.

6. The apparatus of claim 1, wherein the operating voltage comprises a minimum voltage, the minimum voltage sufficient to support the at least one critical path length at an operating frequency for the function and further based on a process variation of the FPGA.

7. The apparatus of claim 6, wherein the minimum voltage is lower than a worst case minimum voltage for the FPGA based on a fastest supported frequency and a slowest process variation.

8. The apparatus of claim 1, wherein the FPGA comprises a plurality of programmable logic circuits, each programmable logic circuit to execute one of a plurality of functions programmed with one of a plurality of bitstreams.

9. The apparatus of claim 8, wherein at least some of the plurality of programmable logic circuits are to operate at independent voltages based on self-testing performed by the self-test circuit for a corresponding programmable logic circuit and function.

10. The apparatus of claim 1, wherein the apparatus comprises a system on chip including the FPGA and one or more processor cores of a central processing unit.

11. A method comprising:
receiving, in a field programmable gate array (FPGA) having at least one programmable logic circuit, a bitstream comprising a programmable function and metadata associated with the bitstream, the metadata to be used to dynamically control an operating voltage of the FPGA based on a priori knowledge of the programmable function;
programming the at least one programmable logic circuit with the bitstream to enable the at least one programmable logic circuit to execute the programmable function;
executing at least one self-test for the programmable function in the FPGA at a first voltage, the metadata to identify the at least one self-test and the first voltage;
determining if the execution of the at least one self-test meets a performance threshold; and
causing the FPGA to operate at the first voltage in response to determining that the execution of the at least one self-test meets the performance threshold.

12. The method of claim 11, further comprising executing the at least one self-test for the function in the FPGA at a second voltage in response to determining that the execution of the at least one self-test does not meet the performance threshold, the second voltage greater than the first voltage.

13. The method of claim 12, wherein the first voltage comprises an estimated minimum operating voltage to execute the function and the second voltage comprises a sum of the estimated minimum operating voltage and a step value.

14. The method of claim 11, further comprising executing the at least one self-test via a self-test circuit of the FPGA, the self-test circuit programmed with at least a portion of the metadata.

15. An apparatus comprising:
a system on chip including at least one core and at least one field programmable gate array (FPGA), the at least one FPGA comprising:
a plurality of programmable logic circuits each to execute a function programmed with a corresponding bitstream;
at least one self-test circuit to execute one or more self-tests to identify and dynamically test a critical path length of the function at one or more first operating voltages, the at least one self-test circuit to be programmed with metadata associated with the corresponding bitstream; and
a power controller to identify a minimum operating voltage for the plurality of programmable logic circuits based on the execution of the one or more self-tests.

16. The apparatus of claim 15, further comprising a semiconductor die including the at least one core and the at least one FPGA.

17. The apparatus of claim 15, further comprising a non-volatile storage coupled to the at least one FPGA, the non-volatile storage to store the corresponding bitstream and the metadata, and wherein the first operating voltage comprises an estimated minimum operating voltage at which the function is to execute to meet a performance threshold.

18. The apparatus of claim 1, wherein the first metadata comprises at least one voltage/frequency table to provide estimated voltage/frequency values for the function.

19. The apparatus of claim 1, wherein the bitstream comprises the first metadata.

20. The apparatus of claim 15, wherein the power controller is to use the metadata to dynamically control an operating voltage of the FPGA based on a priori knowledge of the function.

* * * * *